United States Patent
Obata et al.

(10) Patent No.: US 8,614,455 B2
(45) Date of Patent: Dec. 24, 2013

(54) SEMICONDUCTOR LIGHT EMITTING DEVICE

(75) Inventors: Susumu Obata, Kanagawa-ken (JP); Kazuhito Higuchi, Kanagawa-ken (JP); Hideo Nishiuchi, Hyogo-ken (JP); Akiya Kimura, Kanagawa-ken (JP); Toshiya Nakayama, Kanagawa-ken (JP); Yoshiaki Sugizaki, Kanagawa-ken (JP); Akihiro Kojima, Kanagawa-ken (JP); Yosuke Akimoto, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/424,687

(22) Filed: Mar. 20, 2012

(65) Prior Publication Data
US 2012/0241792 A1 Sep. 27, 2012

(30) Foreign Application Priority Data

Mar. 23, 2011 (JP) .................................. 2011-064909
Mar. 8, 2012 (JP) .................................. 2012-052247

(51) Int. Cl.
*H01L 33/00* (2010.01)

(52) U.S. Cl.
USPC ................... 257/98; 257/88; 257/94; 257/99; 257/E33.072

(58) Field of Classification Search
USPC ......... 257/79, 88, 94, 98–100, 431–433, 344, 257/347; 313/112, 501, 503, 506
See application file for complete search history.

(56) References Cited

U.S. PATENT DOCUMENTS

| 2007/0262338 A1* | 11/2007 | Higashi et al. .................. 257/99 |
| 2011/0073883 A1* | 3/2011 | Osawa et al. .................. 257/88 |
| 2011/0114986 A1* | 5/2011 | Kojima et al. .................. 257/99 |
| 2011/0233585 A1* | 9/2011 | Kojima et al. .................. 257/98 |
| 2011/0297983 A1 | 12/2011 | Nishiuchi et al. |

FOREIGN PATENT DOCUMENTS

JP 8-306853 A 11/1996
(Continued)

OTHER PUBLICATIONS

Office Action issued Jan. 29, 2013 in Korean Patent Application No. 10-2012-28829 with English language translation.

(Continued)

*Primary Examiner* — Dung A Le
(74) *Attorney, Agent, or Firm* — Oblon, Spivak, McClelland, Maier & Neustadt, L.L.P.

(57) ABSTRACT

According to an embodiment, a semiconductor light emitting device includes a stacked body, first and second electrodes, first and second interconnections, first and second pillars and a first insulating layer. The stacked body includes first and second semiconductor layers and a light emitting layer. The first and second electrodes are connected to the first and second semiconductor layers respectively. The first and second interconnections are connected to the first and second electrode respectively. The first and second pillars are connected to the first and second interconnections respectively. The first insulating layer is provided on the interconnections and the pillars. The first and second pillars have first and second monitor pads exposed in a surface of the first insulating layer. The first and second interconnections have first and second bonding pads exposed in a side face connected with the surface of the first insulating layer.

14 Claims, 26 Drawing Sheets

(56) References Cited

FOREIGN PATENT DOCUMENTS

| | | |
|---|---|---|
| JP | 10-313082 A | 11/1998 |
| JP | 2000-101141 A | 4/2000 |
| JP | 2004-207275 A | 7/2004 |
| JP | 2004-363279 A | 12/2004 |
| JP | 2007-48849 A | 2/2007 |
| JP | 2010-3743 A | 1/2010 |
| JP | 2010-21261 A | 1/2010 |
| JP | 2010-135693 | 6/2010 |
| JP | 2010-141176 A | 6/2010 |

OTHER PUBLICATIONS

Office Action issued Mar. 8, 2013 in Japanese Patent Application No. 2012-052247 with English language translation.
U.S. Appl. No. 13/826,935, filed Mar. 14, 2013, Obata, et al.
U.S. Appl. No. 13/826,509, filed Mar. 14, 2013, Kimura et al.
Japanese Office Action Issued Jun. 21, 2013 in Patent Application No. 2012-052247 (with English translation).
Office Action issued Sep. 25, 2013, in Japanese Patent Application No. 2012-052247, filed Mar. 8, 2012, (with English-language Translation).

\* cited by examiner

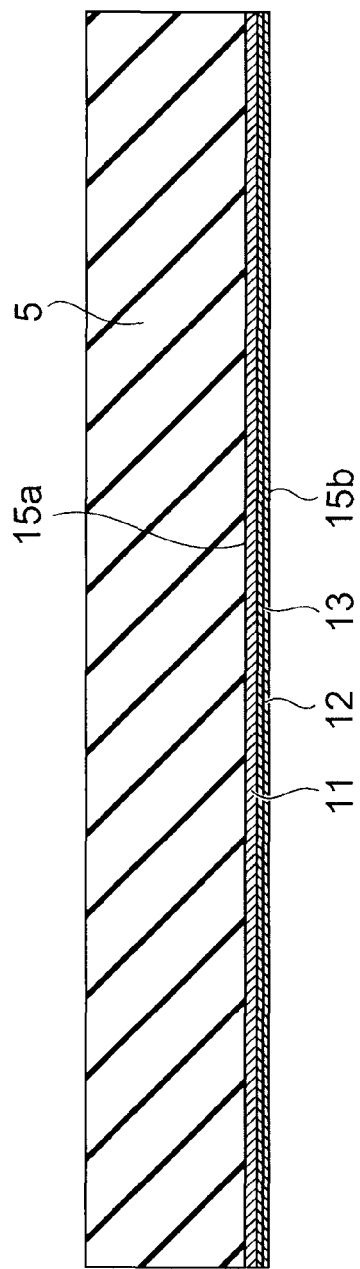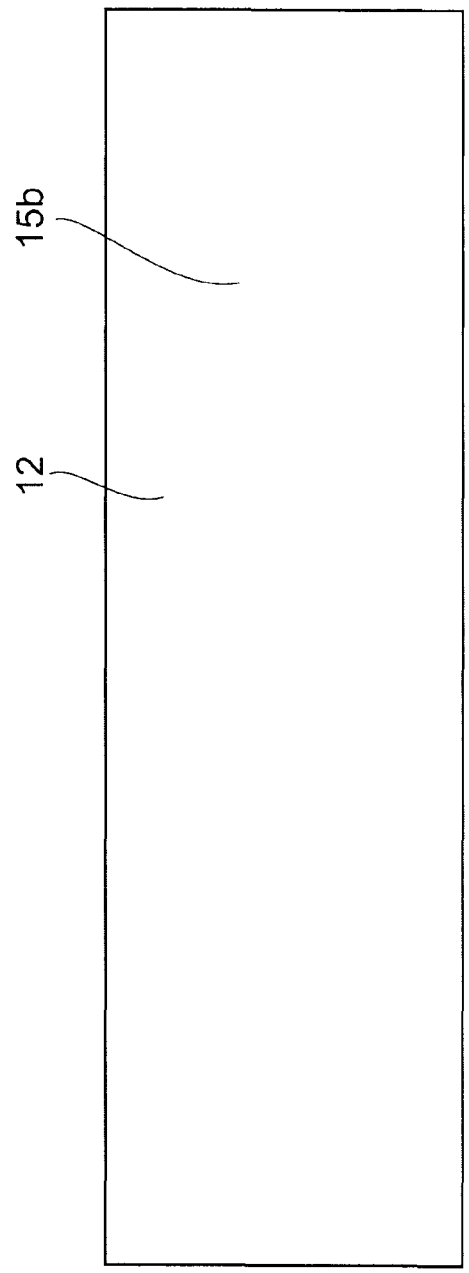
FIG. 3A
FIG. 3B

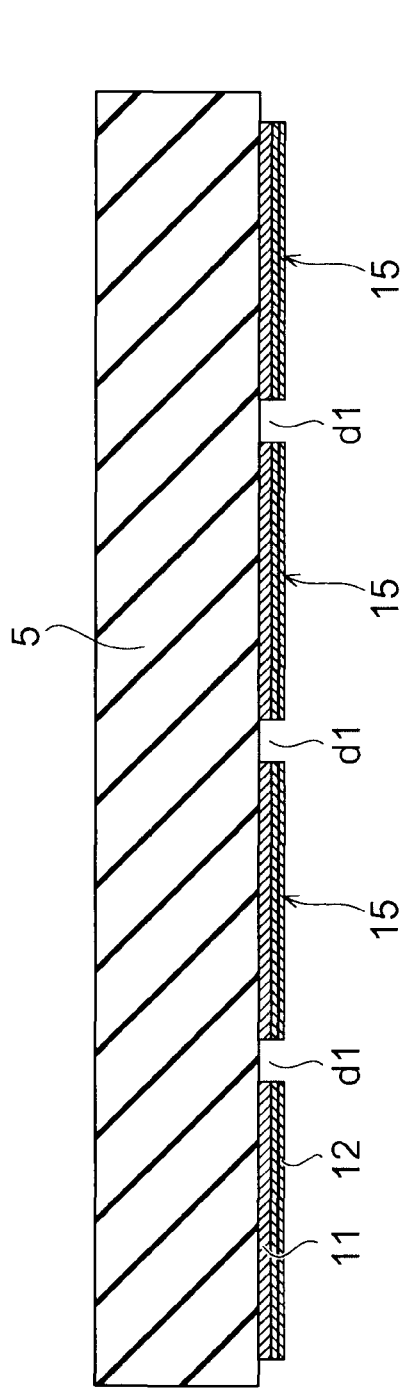
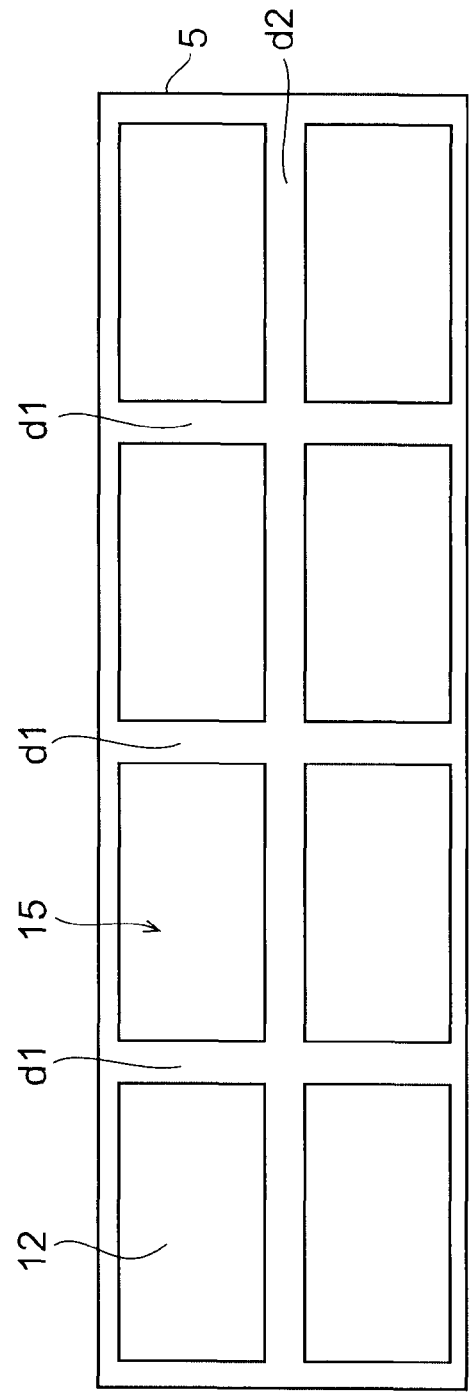
FIG. 4A
FIG. 4B

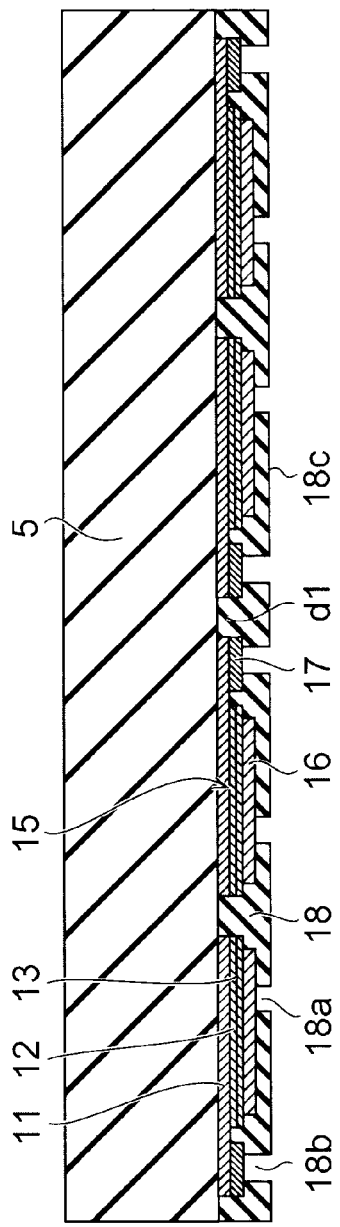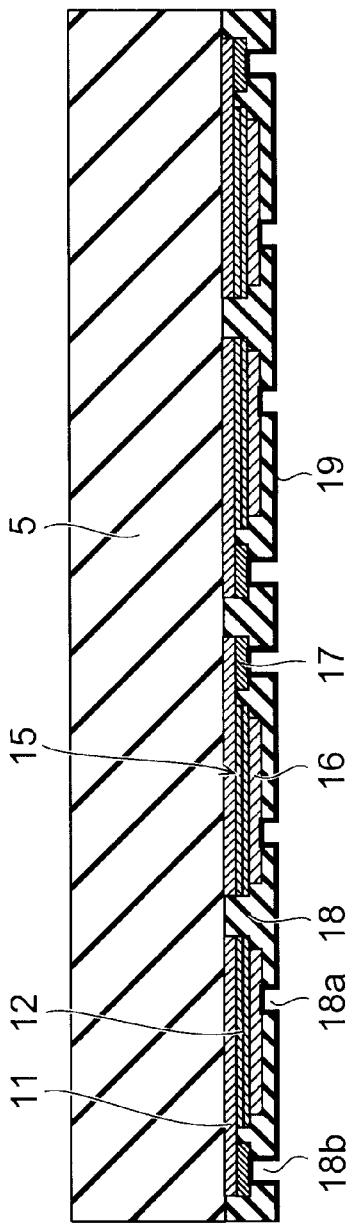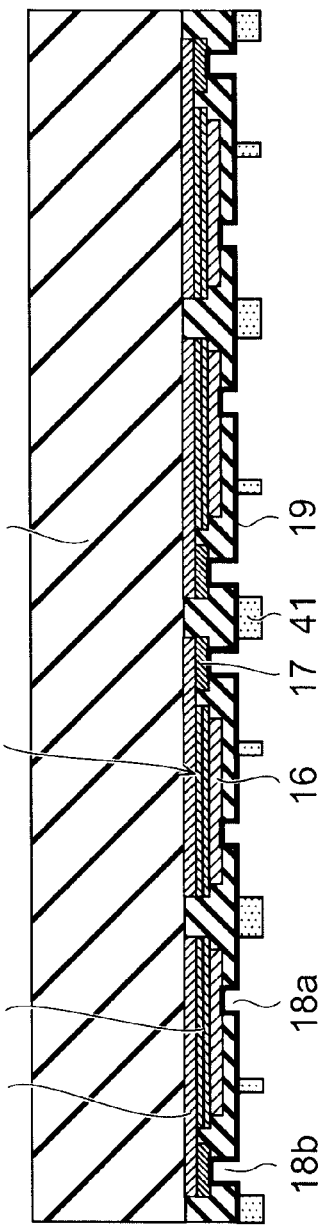
FIG. 7A
FIG. 7B
FIG. 7C

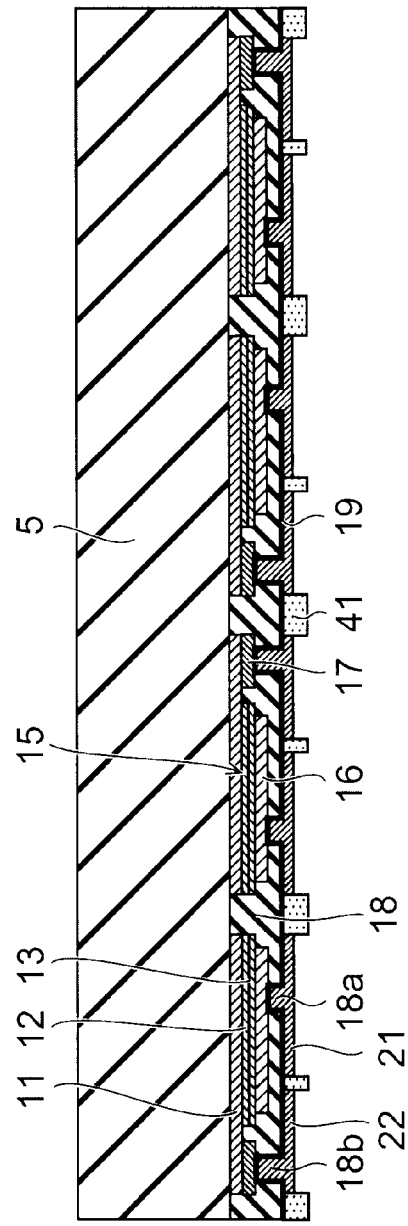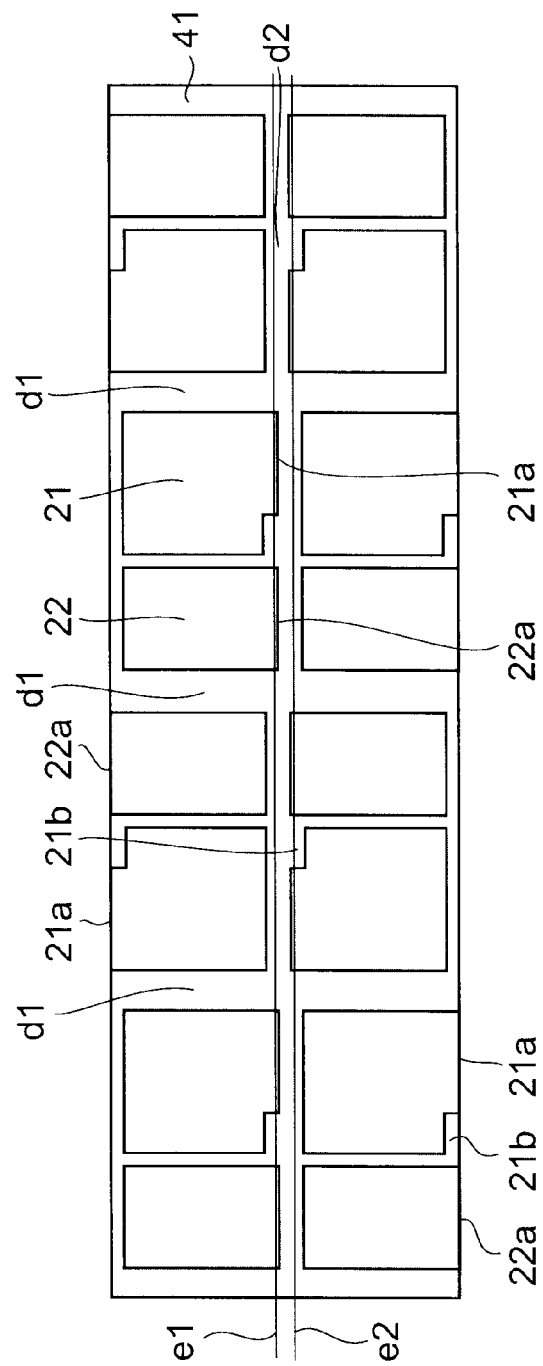
FIG. 8A
FIG. 8B

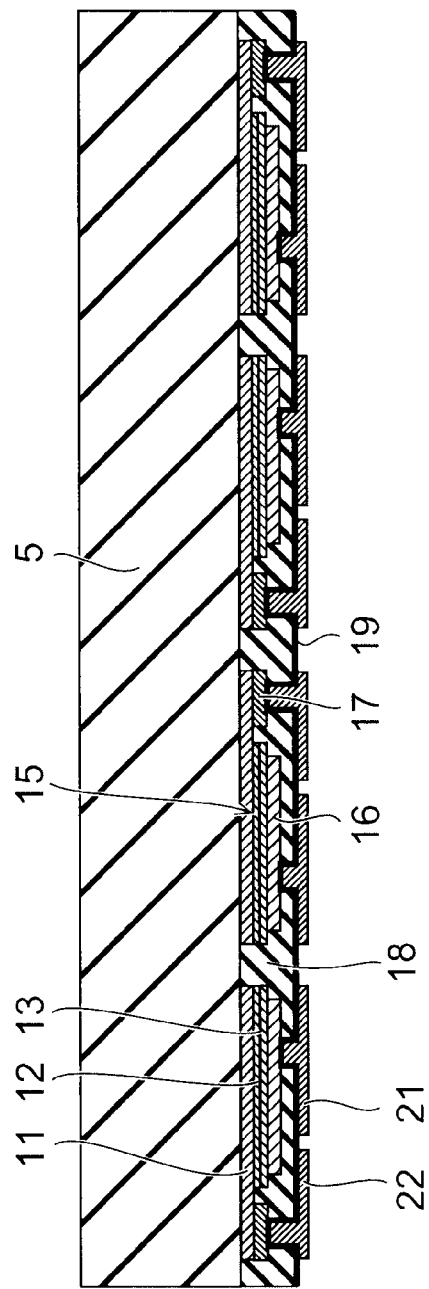
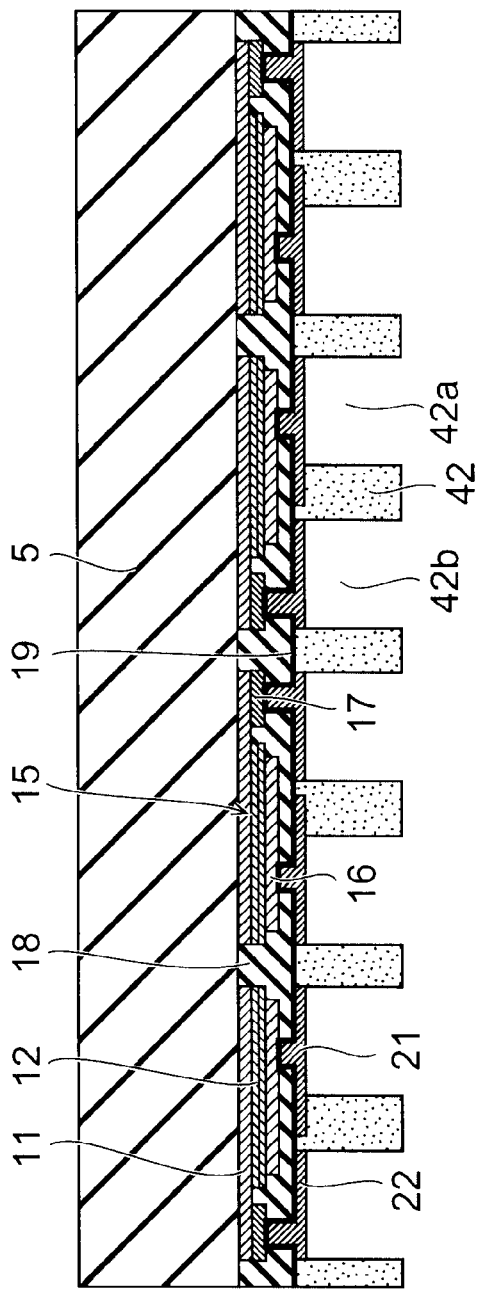
FIG. 9A
FIG. 9B

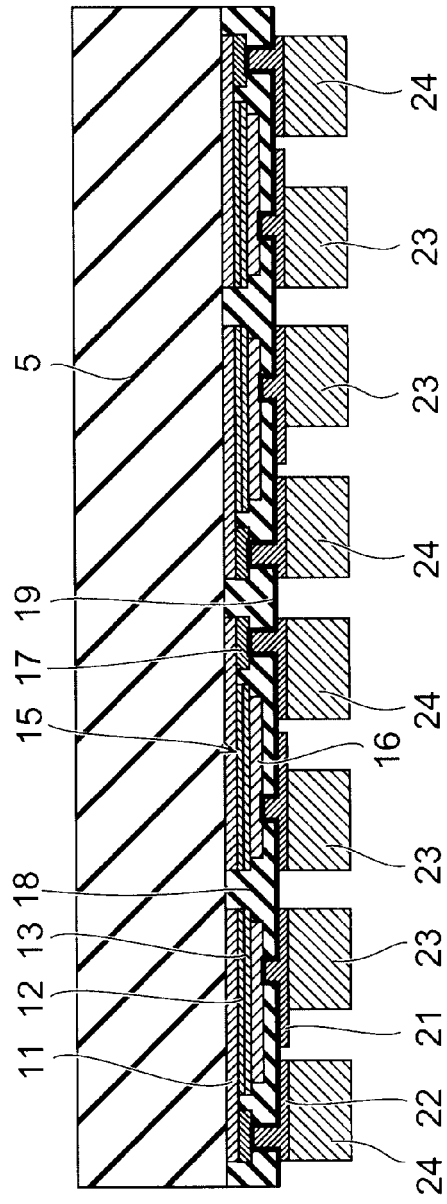
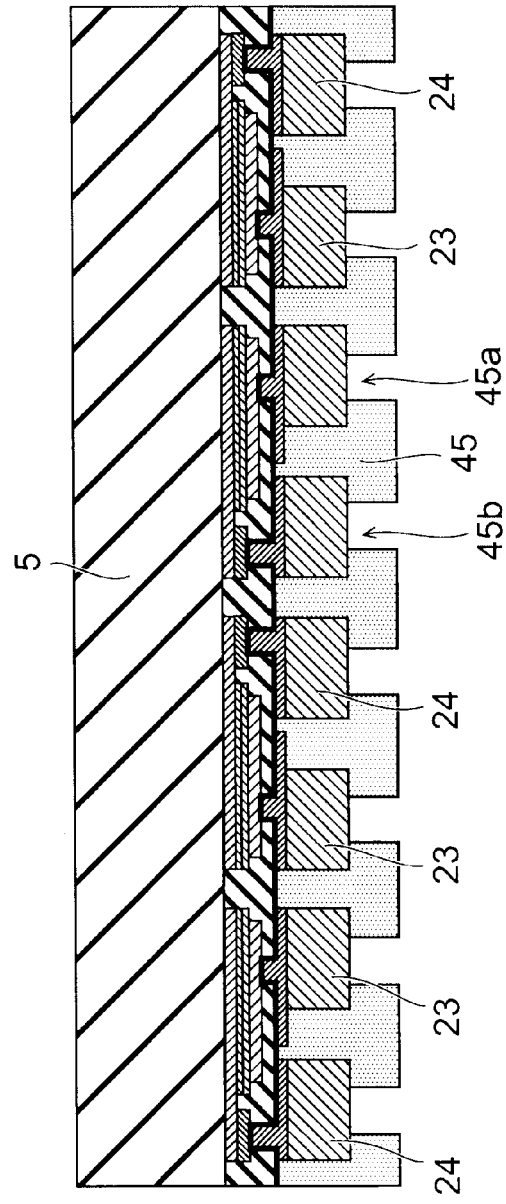
FIG. 11A
FIG. 11B

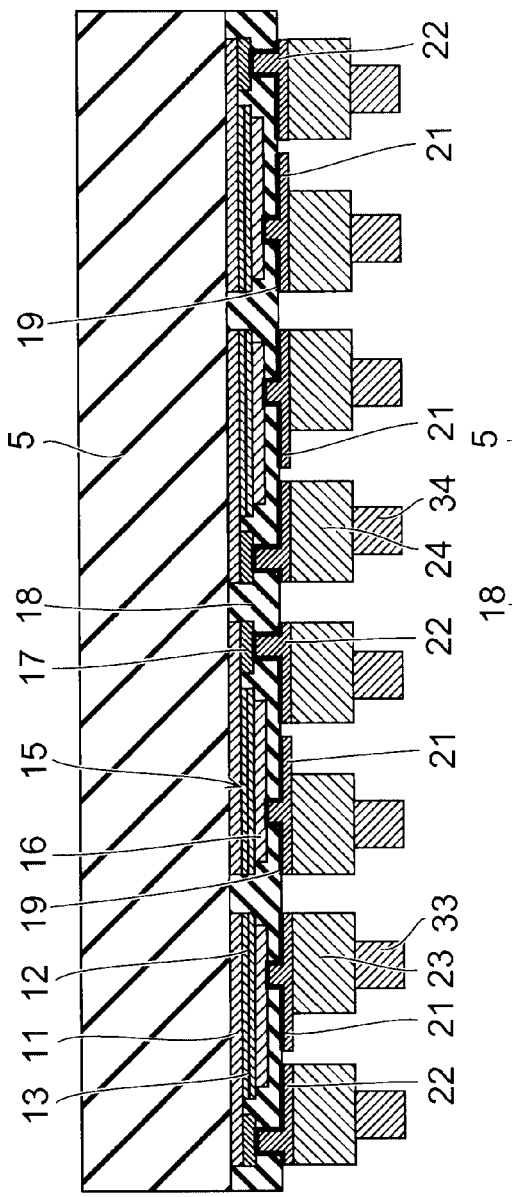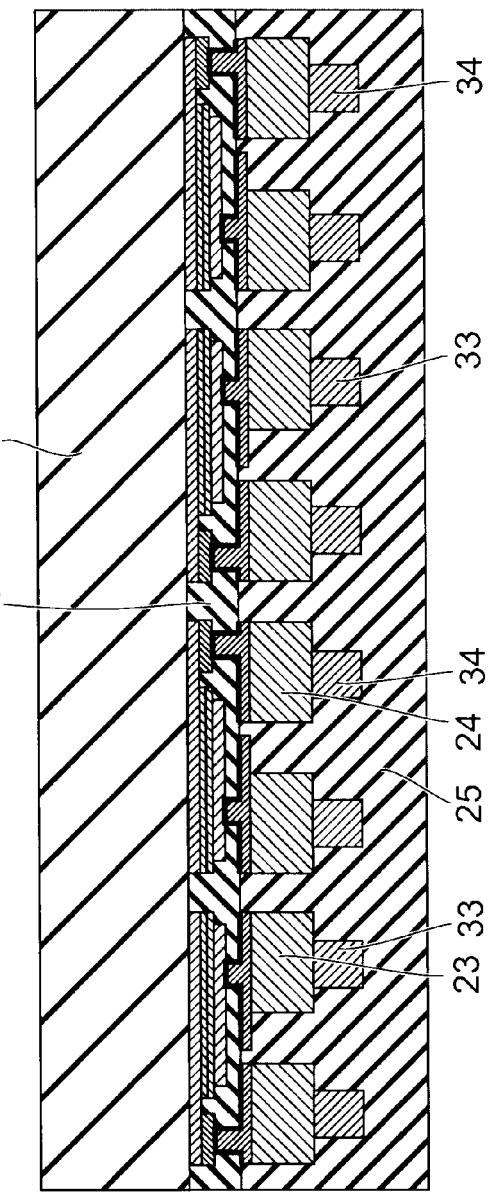
FIG. 14A
FIG. 14B

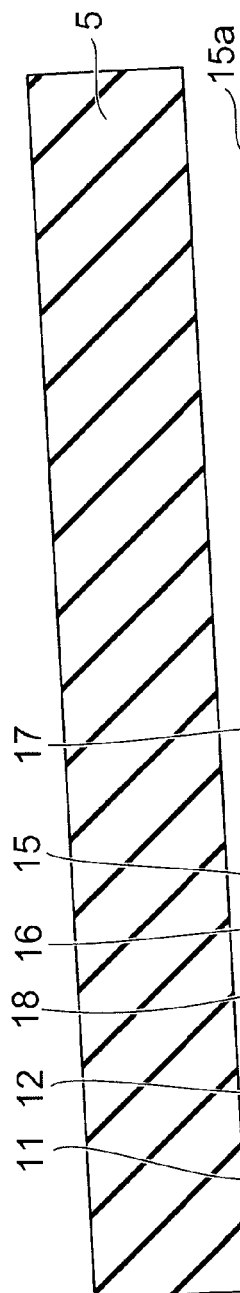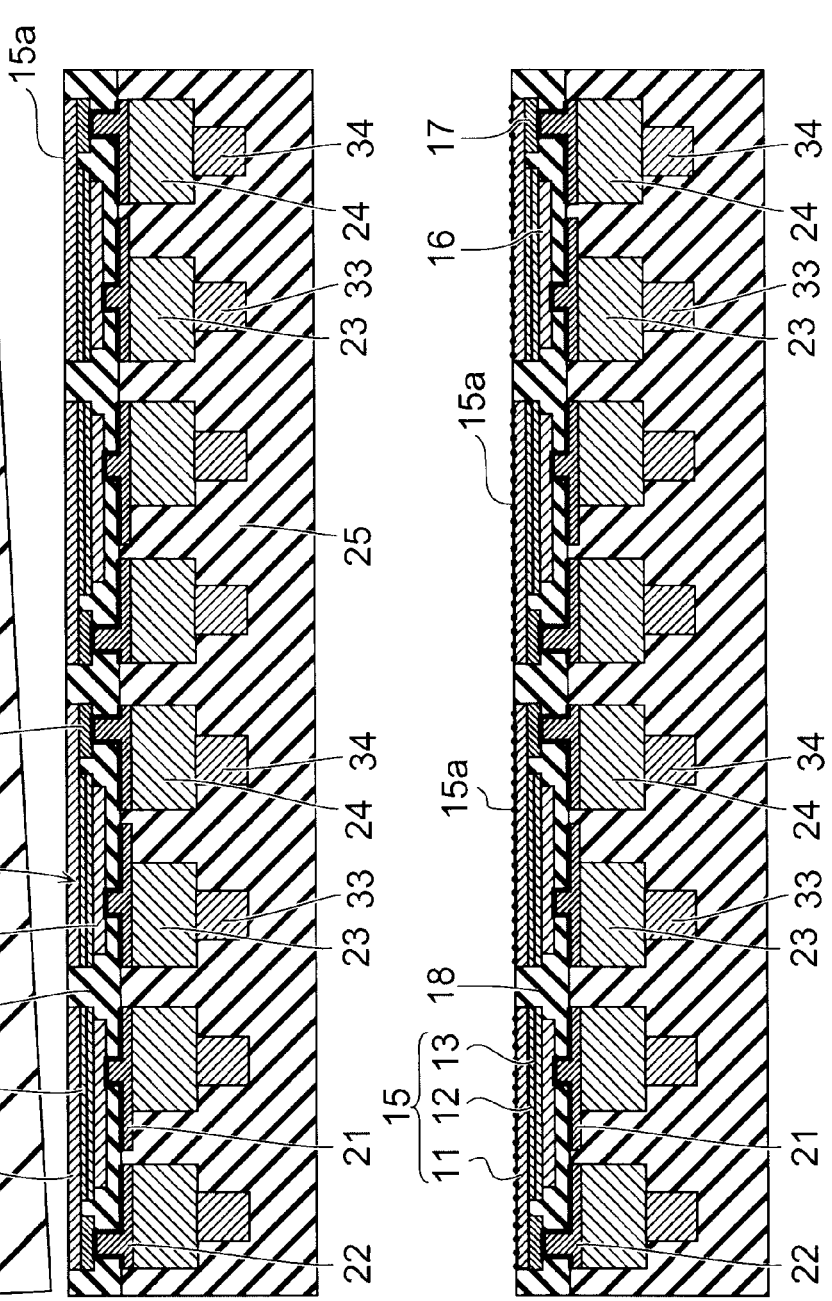
FIG. 15A
FIG. 15B

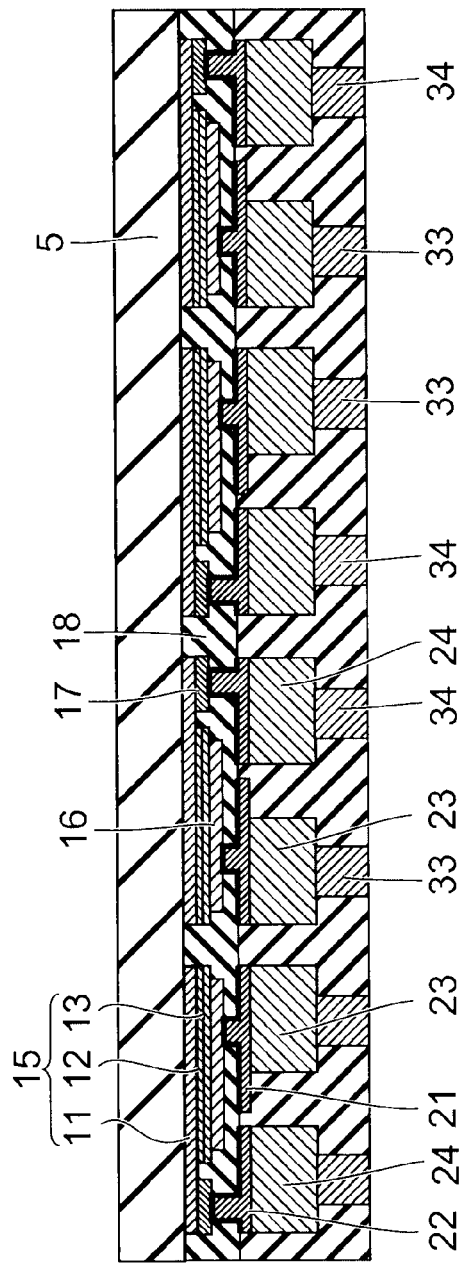
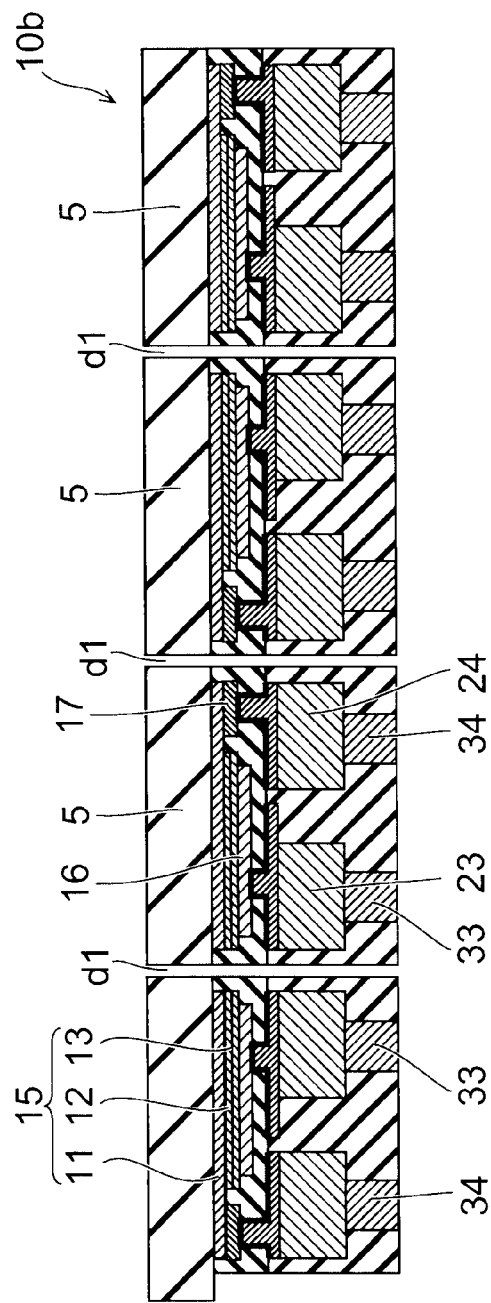
FIG. 20A
FIG. 20B

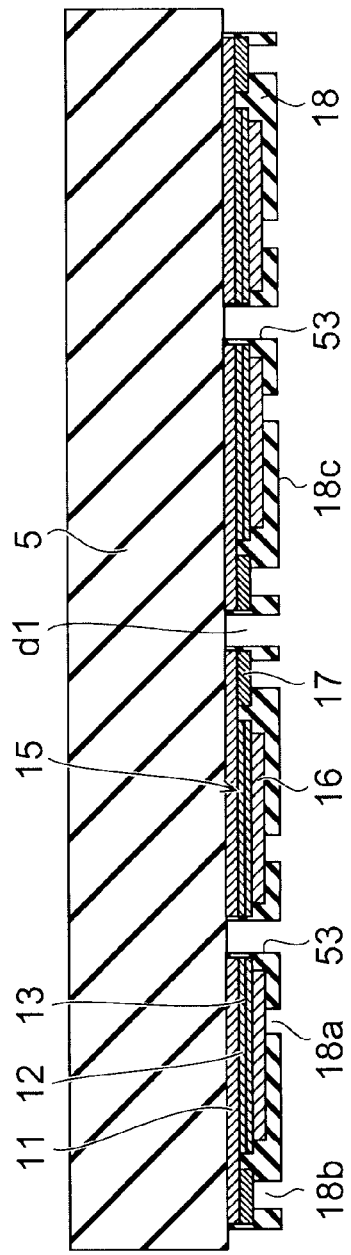
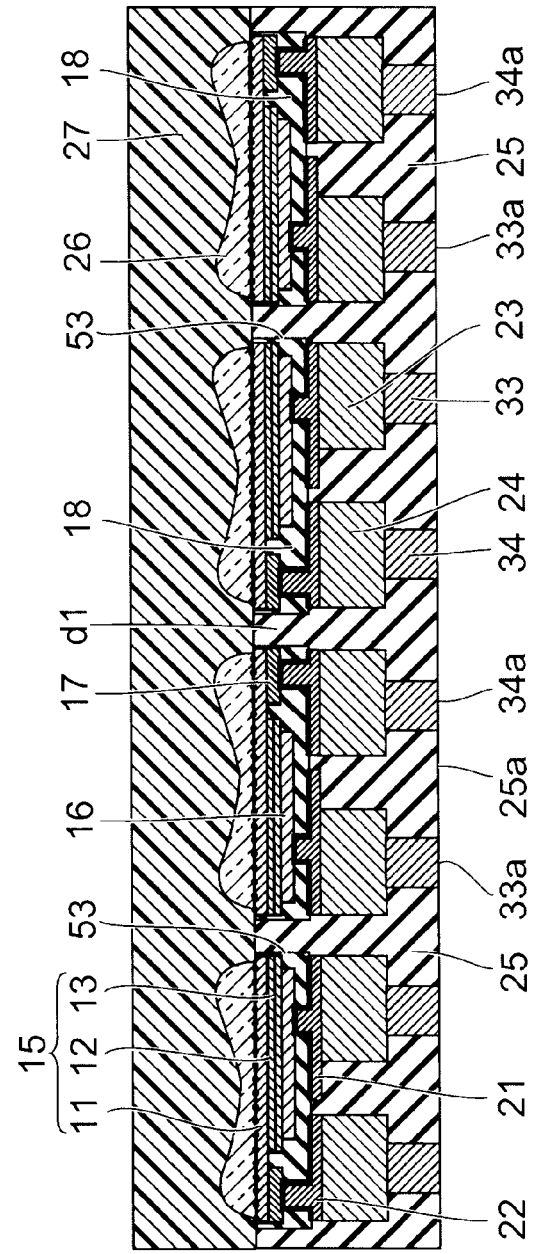
FIG. 21A
FIG. 21B

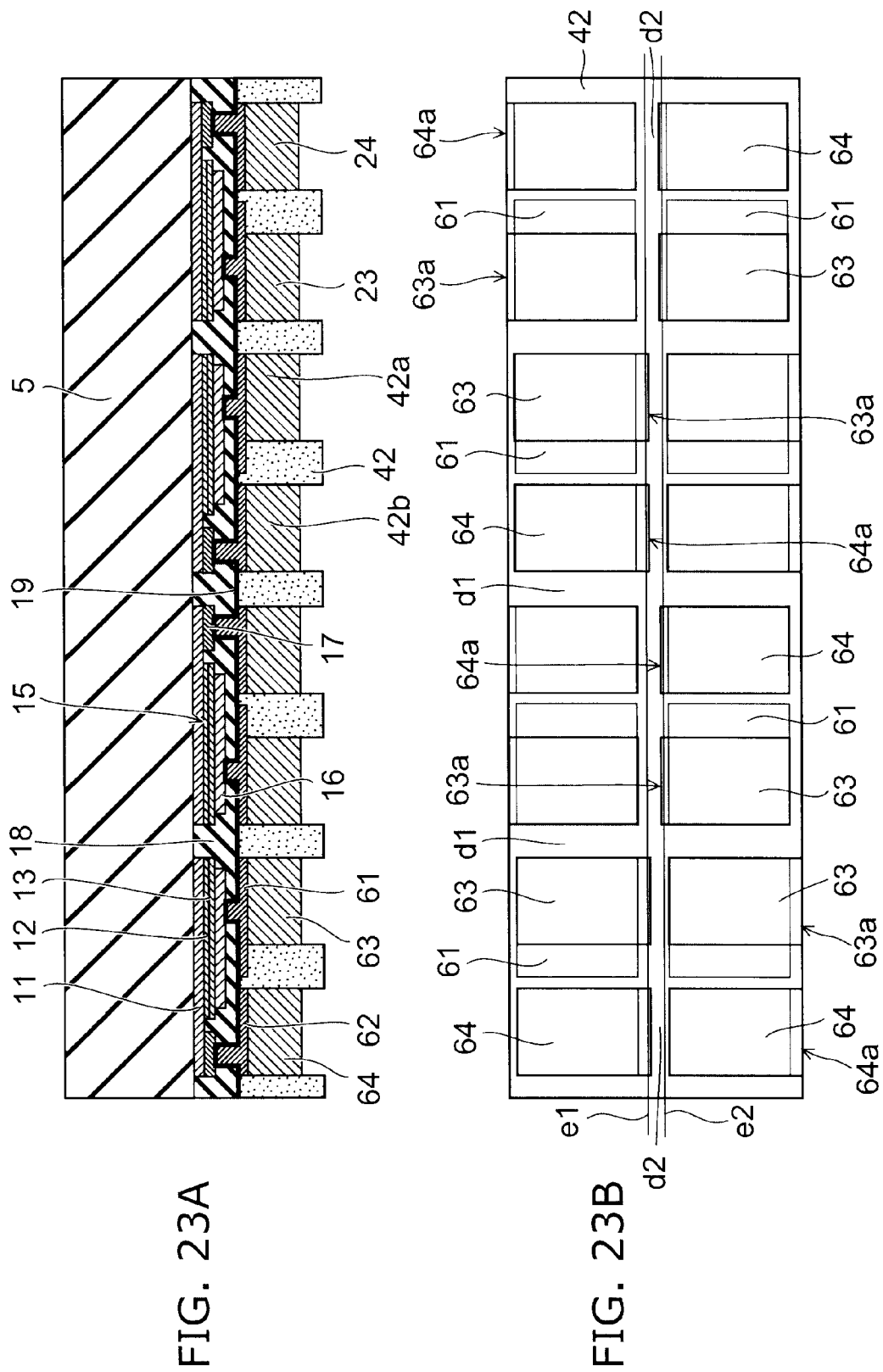

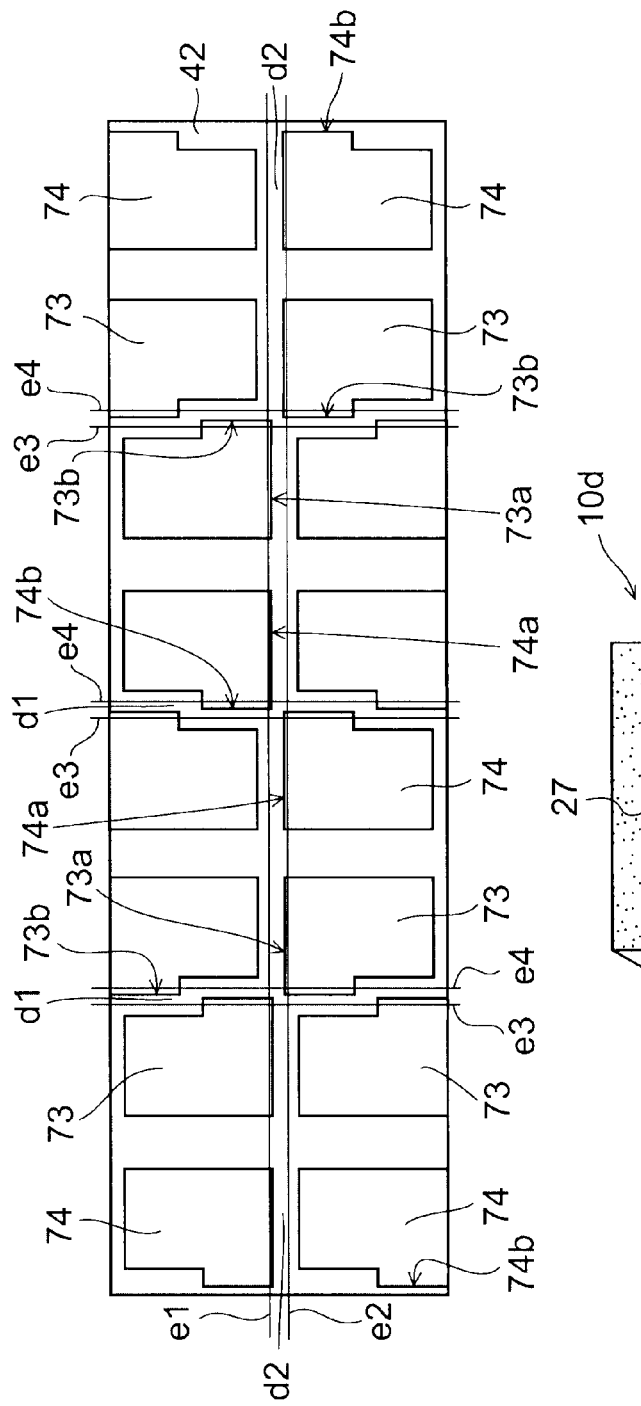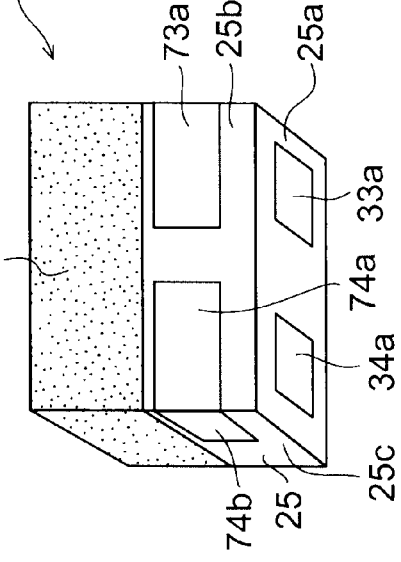
FIG. 24A
FIG. 24B

SEMICONDUCTOR LIGHT EMITTING DEVICE

CROSS-REFERENCE TO RELATED APPLICATIONS

This application is based upon and claims the benefit of priority from Japanese Patent Application No. 2011-064909, filed on Mar. 23, 2011 and No. 2012-052247, filed on Mar. 8, 2012; the entire contents of which are incorporated herein by reference.

FIELD

Embodiments are related to a semiconductor light emitting device and a method for manufacturing the same.

BACKGROUND

Semiconductor light emitting devices that emit visible light or white light are used as light sources for lighting apparatus, display apparatus, or the like, and such applications thereof are expected to increase more than ever. To enhance the convenience of the semiconductor light emitting devices, their size and costs are desired to be reduced. For example, a blue LED (Light Emitting Diode) made of nitride semiconductors is demanded to have a structure suitable for improving productivity and yields, and a manufacturing method is also needed therefore.

BRIEF DESCRIPTION OF THE DRAWINGS

FIGS. 3A to 17B are schematic views illustrating manufacturing processes of the semiconductor light emitting device according to the first embodiment;

FIGS. 18 to 19B are schematic views illustrating manufacturing processes of a semiconductor light emitting device according to a second embodiment;

FIGS. 20A and 20B are schematic views illustrating manufacturing processes of a semiconductor light emitting device according to a third embodiment;

FIGS. 21A and 21B are schematic views illustrating manufacturing processes of a semiconductor light emitting device according to a fourth embodiment;

FIGS. 22A and 23B are schematic views illustrating manufacturing processes of a semiconductor light emitting device according to a fifth embodiment;

FIGS. 24A and 24B are schematic views illustrating manufacturing processes of a semiconductor light emitting device according to a variation of the fifth embodiment;

DETAILED DESCRIPTION

Figure 1A:
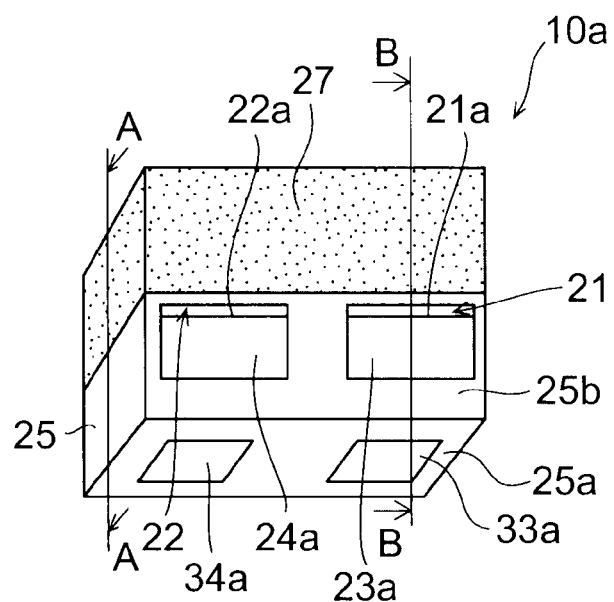
FIGS. 1A to 1C are schematic views illustrating a semiconductor light emitting device according to a first embodiment.

According to an embodiment, a semiconductor light emitting device includes a stacked body, a first electrode, a second electrode, a first interconnection, a second interconnection, a first pillar, a second pillar and a first insulating layer. The stacked body includes a first semiconductor layer of a first conductive type, a second semiconductor layer of a second conductive type, and a light emitting layer provided between the first semiconductor layer and the second semiconductor layer, the stacked body emitting light from a first major surface on a second semiconductor layer side. The first electrode is connected to the first semiconductor layer on a second major surface side of the stacked body opposite to the first major surface. The second electrode is connected to the second semiconductor layer on the second major surface side. The first interconnection is connected to the first electrode. The second interconnection is connected to the second electrode. The first pillar is connected to the first interconnection. The second pillar is connected to the second interconnection; and the first insulating layer is provided on the first interconnection, the second interconnection, the first pillar and the second pillar on the second major surface side. The first pillar has a first monitor pad exposed in a surface of the first insulating layer parallel to the first major surface. The first interconnection has a first bonding pad exposed in a side face connected with the surface of the first insulating layer. The second pillar has a second monitor pad exposed in the surface of the first insulating layer. The second interconnection has a second bonding pad exposed in the side face of the first insulating layer.

Hereinafter, embodiments of the invention will now be described in detail with reference to the drawings. In the embodiments below, the same components in the drawings are designated the same reference numerals, a detailed description is omitted as appropriate, and different components will be described. Here, explanations will be given as a first conductive type is a p-type and a second conductive type is an n-type. It may also be possible that the first conductive type is an n-type and the second conductive type is a p-type.

First Embodiment

Figure 1B:
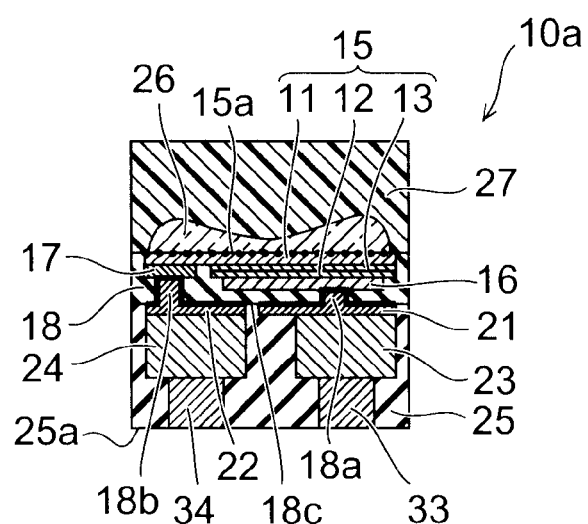
Figure 1C:
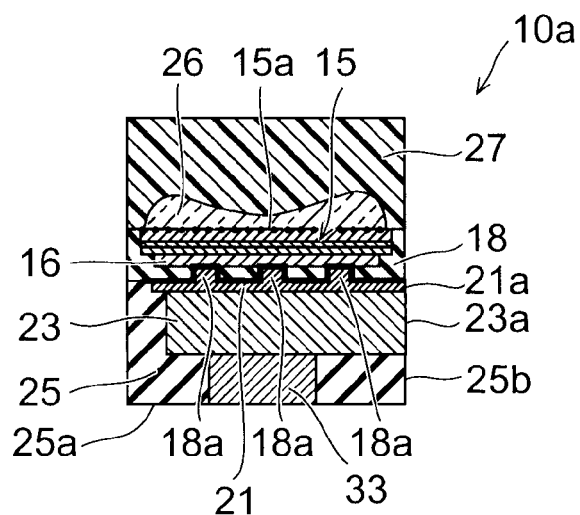

FIG. 1A is a perspective view schematically illustrating a semiconductor light emitting device 10a according to a first embodiment. FIG. 1B is a cross-sectional view along a line A-A in FIG. 1A. FIG. 1C is a cross-sectional view along a line B-B in FIG. 1A.

As shown in FIG. 1A, the semiconductor light emitting device 10a has an appearance of a rectangular parallelepiped, including an insulating resin layer 25 (a first insulating layer) and a transparent resin layer 27. A first bonding pad 23a and a second bonding pad 24a are exposed in a side face 25b of the insulating resin layer 25. A first monitor pad 33a and a second monitor pad 34a are provided on a surface 25a that is one major surface, opposite to the transparent resin layer 27, of the insulating resin layer 25.

As shown in FIG. 1B, the semiconductor light emitting device 10a includes a stacked body 15 including a p-type GaN layer 12 (a first semiconductor layer), an n-type GaN layer 11 (a second semiconductor layer), and a light emitting layer 13. The light emitting layer 13 is provided between the p-type GaN layer 12 and the n-type GaN layer 11. The stacked body 15 has a first major surface 15a on the n-type GaN layer 11 side and a second major surface 15b on the opposite side thereof. The stacked body 15 emits light from the first major surface 15a side, where the light is emitted from the light emitting layer.

The light emitted from the stacked body 15 is transmitted through the transparent resin layer 27, and emitted to outwards. A lens 26 can be provided between the stacked body 15 and the transparent resin layer 27. The lens 26 collects the light emitted from the stacked body 15, and improves directivity. Further, the lens 26 may also improve luminous intensity distribution and suppress a chromaticity change.

A p-side electrode 16 electrically connected to the p-type GaN layer 12 and an n-side electrode 17 electrically connected to the n-type GaN layer 11 are provided on the second major surface side of the stacked body 15. The p-side electrode is a first electrode and the n-side electrode is a second electrode. The n-side electrode 17 is provided on a surface of the n-type GaN layer 11, where the p-type GaN layer 12 and the light emitting layer 13 are selectively removed by etching.

An insulating layer 18 (a second insulating layer) is provided to cover the stacked body 15 on which the p-side electrode 16 and the n-side electrode 17 are provided. The insulating layer 18 is made of polyimide, for example. A p-side intermediate electrode 21 and an n-side intermediate electrode 22 are provided on the insulating layer 18, where the p-side intermediate electrode 21 and the n-side intermediate electrode 22 are electrically connected respectively to the p-side electrode 16 and the n-side electrode 17 through contact holes 18a and 18b formed in the insulating layer 18. The p-side intermediate electrode 21 is a first intermediate electrode, and the n-side intermediate electrode 22 is a second intermediate electrode.

The insulator layer 18 may also be made of inorganic material, such as silicon oxide, silicon nitride (SiN), aluminum nitride (AlN), aluminum oxide (AlO) or the like. These inorganic materials have larger thermal conductivity than the organic materials, e.g. polyimide, and enhance heat dissipation from the stacked body 15 via the p-side electrode 16. Thereby, using the inorganic materials improves the light emitting efficiency in the light emitting layer 13. Furthermore, it is possible to improve the reliability in the semiconductor light emitting device 10a, since the inorganic materials have higher resistances against heat and light emitted from the light emitting layer 13 comparing to the organic material, such as polyimide.

A p-side interconnection 23 is provided on the surface of the p-side intermediate electrode 21. The p-side interconnection 23 is electrically connected to the p-side electrode 16 via the p-side intermediate electrode 21. An n-side interconnection 24 is provided on the surface of the n-side intermediate electrode 22. The n-side interconnection 24 is electrically connected to the n-side electrode 17 via the n-side intermediate electrode 22. The p-side interconnection 23 and the n-side interconnection 24 extend in a direction parallel with the second major surface 15b of the stacked body 15. The p-side interconnection 23 is a first interconnection, and the n-side interconnection 24 is a second interconnection.

A p-side pillar 33 and an n-side pillar 34 are provided on the p-side interconnection 23 and the n-side interconnection 24, respectively. The p-side pillar 33 is a first pillar, and the n-side pillar 34 is a second pillar.

Copper, gold, nickel, silver, or the like can be used for materials of the p-side intermediate electrode 21, the n-side intermediate electrode 22, the p-side interconnection 23, the n-side interconnection 24, the p-side pillar, and the n-side pillar 34. Among them, copper is preferably used so as to obtain excellent thermal conductivity, high migration resistance, and excellent adhesion to insulating materials.

The p-side interconnection 23, the n-side interconnection 24, the p-side pillar 33, and the n-side pillar 34 are covered with the insulating resin layer 25. Epoxy resin, silicone resin, fluorine resin, or the like can be used for the material of the insulating resin layer 25, for example.

The p-side pillar 33 and the n-side pillar 34 extend to the surface 25a of the insulating resin layer 25 in a direction vertical to the second major surface 15b of the stacked body 15, and the monitor pads 33a and 34b, which are the end faces of the p-side pillar 33 and the n-side pillar 34, are exposed in the surface 25a of the insulating resin layer 25.

As shown in FIG. 1C, the p-side interconnection 23 extends in a direction parallel with the second major surface 15b, and is exposed in a side face 25b. The side face 25b contacts almost vertically with the surface 25a of the insulating resin layer 25. The n-side interconnection 24 similarly extends in the direction parallel with the second major surface 15b, and is exposed in the side face 25b in which the p-side interconnection 23 is exposed. The end faces of the p-side interconnection 23 and the n-side interconnection 24 are exposed as the bonding pads 23a and 24a in the side face 25b of the insulating resin layer 25.

When the semiconductor light emitting device 10a is bonded to a mounting substrate, the bonding pads 23a and 24a are connected to power supply interconnections with solder, for example. On the other hand, the monitor pads 33a and 34b are used for contact pads, when inspecting the characteristics of the semiconductor light emitting device 10a in a wafer state, for example.

The bonding pads 23a and 24a are exposed in the side face 25b of the insulating resin layer 25, after separating the semiconductor light emitting device 10a into individual chips. Thus, the bonding pads 23a and 24a are not emerged yet in the wafer state and covered with the insulating resin layer 25, and only the monitor pads 33a and 34a are exposed in the surface 25a of the insulating resin layer 25.

In the semiconductor light emitting device 10a according to the embodiment, the monitor pads 33a and 34a are provided to allow inspection of characteristics in the wafer state using measurement probes. Namely, a driving current is supplied to the stacked body 15 through the monitor pads 33a and 34a for inspecting current voltage characteristics and light emitting characteristics, for example. Thus, it becomes possible to sort out defective chips in the wafer state, ultimately improving the manufacturing yield.

Figure 2:
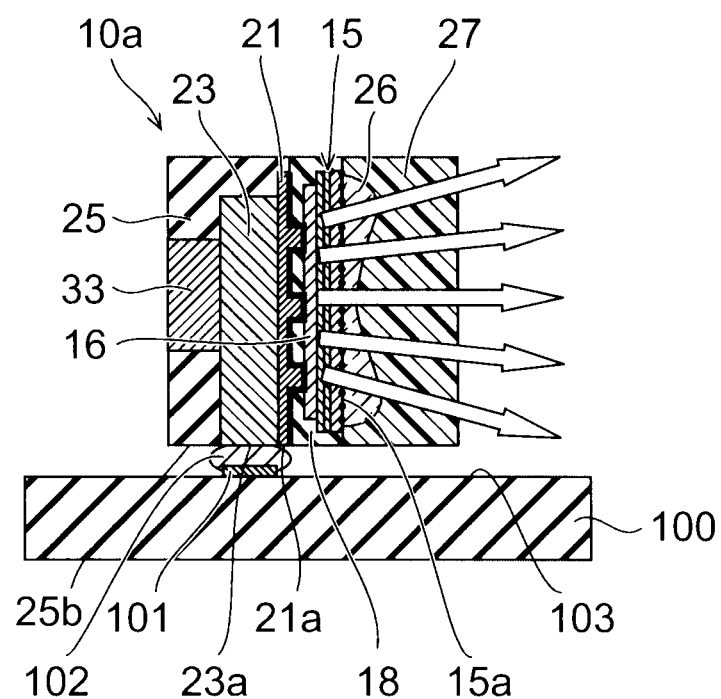
FIG. 2 is a schematic cross-sectional view illustrating a light emitting module according to the first embodiment.

FIG. 2 is a schematic view illustrating a cross section of a light emitting module using the semiconductor light emitting device 10a. The semiconductor light emitting device 10a is mounted on a mounting substrate 100.

The semiconductor light emitting device 10a is die-bonded on a mounting substrate 100, for example, wherein the side faces of the insulating resin layer 25 and the transparent resin layer 27 are faced to a mounting surface 103. The bonding pads 23a and 24a exposed in the side face 25b of the insulating resin layer 25 are joined with the solder 102 to a pad 101 provided on the mounting surface 103. A wiring pattern (not shown) is provided on the mounting surface 103, and the bonding pads 23a and 24a are electrically connected to the wiring pattern via the pad 101.

The side faces of the insulating resin layer 25 and the transparent resin layer 27 are almost vertical to the first major surface 15a of the stacked body 15. Thus, when the side face 25b of the insulating resin layer 25 and the side face of the transparent resin layer 27 are faced to the mounting surface 103 for die bonding, the first major surface 15a and the surface of the transparent resin layer 27 provided nearly in parallel with the first major surface 15a turn in the transverse direction. That is, a so-called sideview type light emitting device and module, which emits light in the transverse direction, can be configured using the semiconductor light emitting device 10a, in the case where the mounting surface 103 is placed in a horizontal plane.

Such a light emitting module is suited for a backlight of a liquid crystal display apparatus in which the light is applied to the side face of a light guide plate. The semiconductor light emitting device 10a according to this embodiment has almost the same size as the size of the stacked body 15, thereby it realizes a chip size light source effective for downsizing the liquid crystal display apparatus.

In a state in which the semiconductor light emitting device 10a is bonded to the mounting substrate 100, the p-side interconnection 23, the n-side interconnection 24, and the insulating resin layer 25 absorb the stress of the solder 102. Thus, it is possible to reduce the stress applied to the stacked body 15, and to suppress the deterioration in optical output and enhance the device reliability. It is noted that conductive paste or the like may be used for mounting instead of the solder 102.

Next, a manufacturing method for the semiconductor light emitting device 10a according to this embodiment will be described with reference to FIG. 3A to FIG. 17B. The drawing illustrates a part of a wafer in each process steps.

FIG. 3A illustrates the epitaxial layers in which the n-type GaN layer 11, the p-type GaN layer 12, and the light emitting layer 13 are formed on the major surface of the substrate 5. FIG. 3B is a bottom view corresponding to FIG. 3A.

The n-type GaN layer 11 is formed on the major surface of the substrate 5, and the light emitting layer 13 and the n-type GaN layer 12 are formed thereon. A sapphire substrate, for example, can be used for the substrate 5, and a GaN based semiconductor layer is growth on the major surface using MOCVD (Metal Organic Chemical Vapor Deposition). It may be possible to use a silicon substrate for the substrate 5.

For example, a buffer layer, not shown, may be formed between the n-type GaN layer 11 and the substrate 5. The n-type GaN layer 11 contains silicon (Si), for example, as an n-type impurity. On the other hand, the p-type GaN layer 12 contains magnesium (Mg), for example, as a p-type impurity. The light emitting layer 13 includes a quantum well made of GaN and InGaN, for example, and emits blue, violet, blue violet lights or the like. It is also possible to emit ultraviolet light using AlGaN for the light emitting layer 13.

The first major surface 15a of the stacked body 15 is a surface of the n-type GaN layer 11 that is in contact with the substrate 5. The surface of the p-type GaN layer 12 is the second major surface 15b of the stacked body 15.

Subsequently, as shown in FIG. 4A and in FIG. 4B that is a bottom view of FIG. 4A, grooves are formed to penetrate the epitaxial layers and reach the substrate 5 in dicing regions d1 and d2. For example, the grooves are formed by etching the epitaxial layers using a resist mask, not shown, and RIE (Reactive Ion Etching) method. The dicing regions d1 and d2 are formed in a grid, for example, on the substrate 5. The epitaxial layers are separated, with the grooves formed in the dicing regions d1 and d2, into individual units (the stacked bodies 15) included in the semiconductor light emitting device 10a.

Alternatively, the process of separating the epitaxial layers into the stacked bodies 15 may be carried out after selectively etching the p-type GaN layer 12, or after forming electrodes.

Figure 5A:
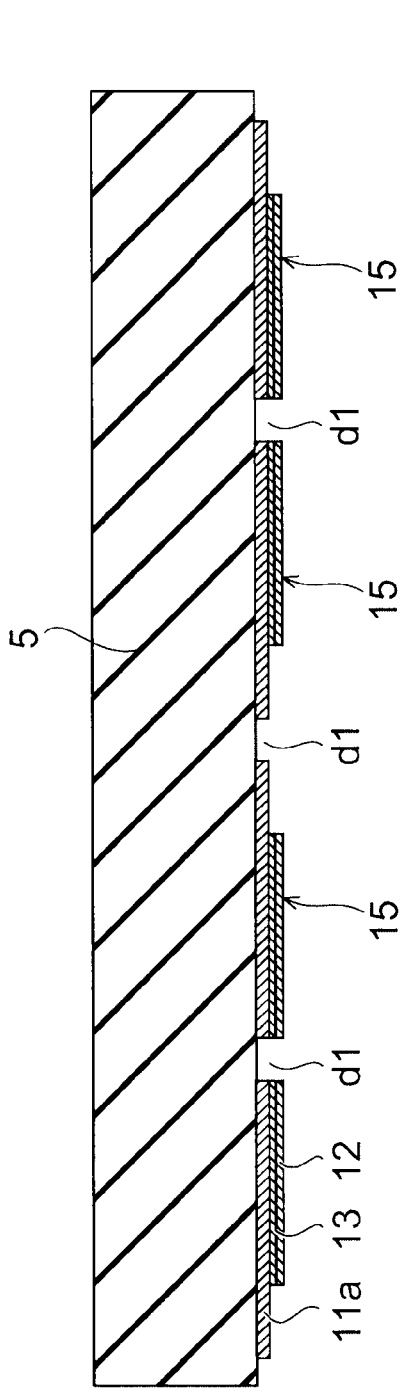

Subsequently, as shown in FIG. 5A and in FIG. 5B that is a bottom view of FIG. 5A, a part of the p-type GaN layer 12 and the light emitting layer 13 is selectively removed using RIE method, and a part of the n-type GaN layer 11 is exposed on the second major surface 15b side. For example, a resist mask, not shown, is formed on the surface of the stacked body 15 for etching the p-type GaN layer 12 and the light emitting layer.

Figure 5B:
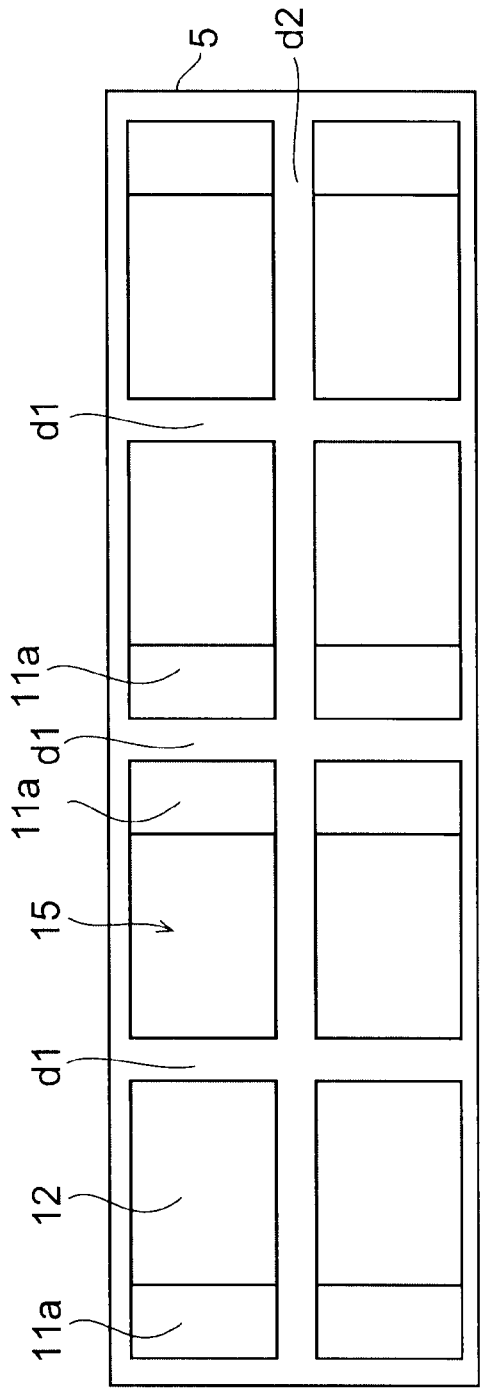

As shown in FIG. 5B, the stacked body 15 is arranged along the dicing region d2 such as an exposed surface 11a of the n-type GaN layer 11 is alternately and inversely formed in the arranged direction. In the other words, the exposed surfaces 11a are disposed so as to face each other, sandwiching the dicing region d1. The disposition of the exposed surface of the n-type GaN layer 11 is not limited to this example, and the exposed surface may be formed in the same side of the stacked body along the dicing region d2.

Figure 6A:
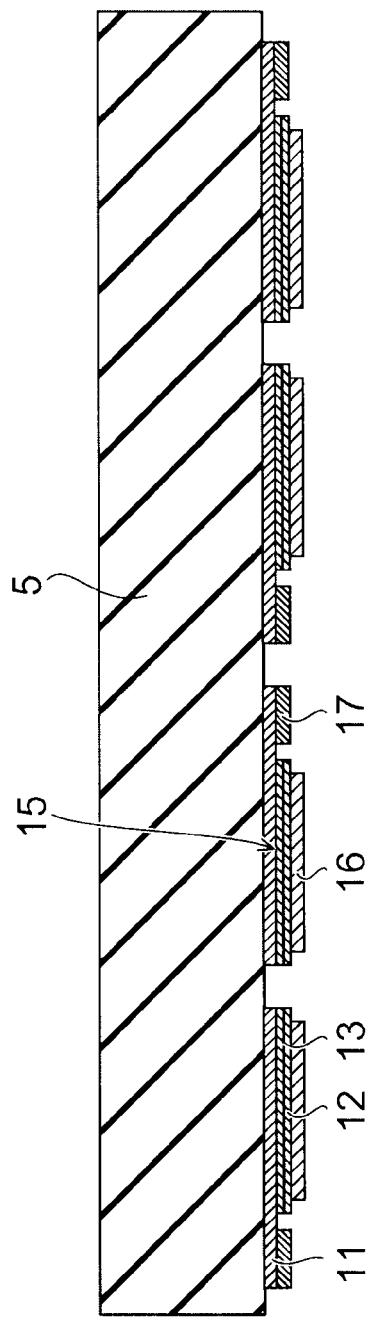
Figure 6B:
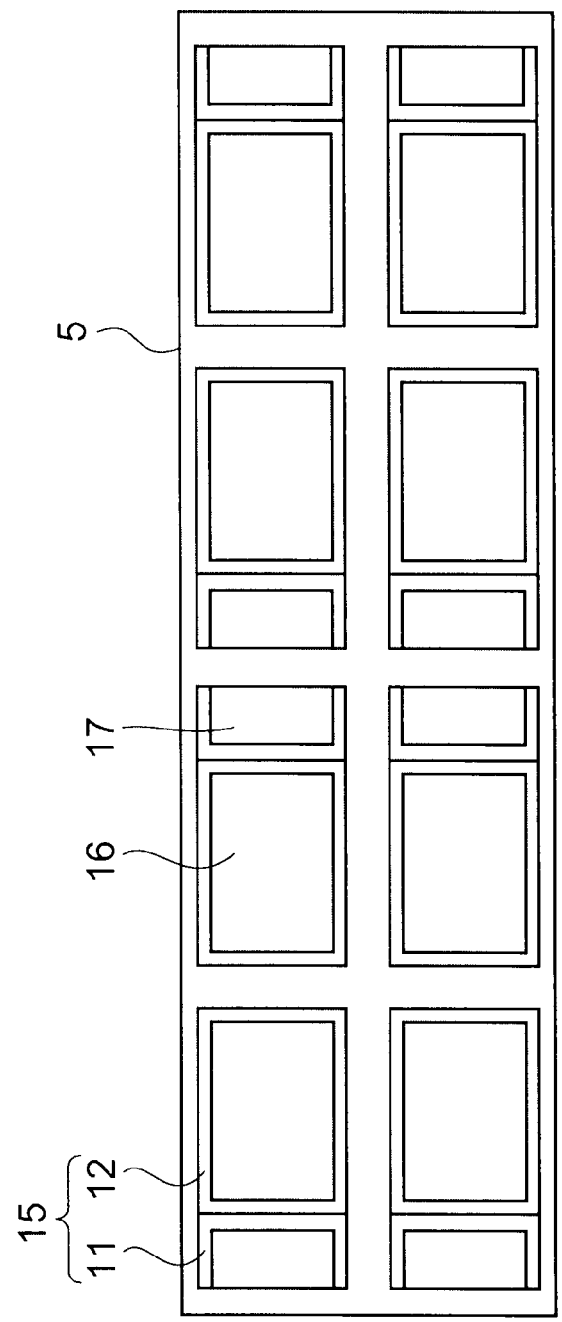

Subsequently, as shown in FIG. 6A and in FIG. 6B that is a bottom view of FIG. 6A, the p-side electrode 16 and the n-side electrode 17 are formed on the second major surface 15b side. As shown in FIG. 6B, the p-side electrode 16 and the n-side electrode 17 are formed in the direction along the dicing region d2 so that the disposition of the p-side electrode 16 and the n-side electrode 17 is alternately inverted. The p-side electrode 16 is formed on the surface of the p-type GaN layer 12. The p-side electrode 16 may be formed on a transparent electrode provided on the surface of the p-type GaN layer 12. The n-side electrode 17 is formed on the exposed surface 11a of the n-type GaN layer 11 using a stacked film of titanium (Ti) and aluminum (Al), for example.

The p-side electrode 16 and the n-side electrode 17 are formed by sputtering, vapor deposition, or the like, for example. The p-side electrode 16 and the n-side electrode 17 may be formed in this order and vice versa. It may be possible to form the p-side electrode 16 and the n-side electrode 17 at the same time using the same material.

Preferably, the p-side electrode 16 has a property of reflecting the light emitted from the light emitting layer 13. The p-side electrode 16 includes silver, silver alloy, aluminum, aluminum alloy, or the like, for example. The p-side electrode 16 may also include a metal protection film to suppress sulfuration and oxidation.

A passivation film may be formed between the p-side electrode 16 and the n-side electrode 17, and on the end face (the side face) of the light emitting layer 13. A silicon nitride film or a silicon oxide film is formed as the passivation film using CVD (Chemical Vapor Deposition), for example. Activation annealing is carried out as necessary in order to form ohmic contact between the p-side electrode 16 and the n-side electrode 17 and the stacked body 15.

Subsequently, as shown in FIG. 7A, after covering all the portions exposed on the major surface of the substrate 5 with the insulating layer 18, the contact holes 18a and 18b are selectively formed in the insulating layer 18 by using wet etching, for example. The contact hole 18a is in communication with the p-side electrode 16 and the contact hole 18b is in communication with the n-side electrode 17.

An organic material such as photosensitive polyimide and benzocyclobutene, for example, can be used for the insulating layer 18. In such a case, the insulating layer 18 can be patterned by directly exposing and developing the insulating layer 18 using photolithography. Alternatively, an inorganic film such as a silicon nitride film or a silicon oxide film may be used for the insulating layer 18. In the case of using an inorganic film, after patterning a resist provided thereon, a desired shape can be formed by etching.

Subsequently, as shown in FIG. 7B, a seed metal 19 is formed on a surface 18c of the insulating layer 18 opposite to the stacked body 15. The seed metal 19 is also formed on the inner wall and bottom of the contact hole 18a and the inner wall and bottom of the contact hole 18b.

The seed metal 19 is formed by sputtering, for example. The seed metal 19 includes a stacked film of titanium (Ti) and copper (Cu) stacked in turn from the insulating layer 18 side, for example.

Subsequently, as shown in FIG. 7C, a resist mask 41 is selectively formed on the seed metal 19, and electrolytic copper (Cu) plating is carried out through the resist mask 41.

A plating current flows via the seed metal 19, and a Cu film is formed on the surface of the seed metal 19.

Thus, as shown in FIG. 8A and in FIG. 8B that is a bottom view of FIG. 8A, the p-side intermediate electrode 21 and the n-side intermediate electrode 22 are selectively formed on the surface 18c of the insulating layer 18. The p-side intermediate electrode 21 and the n-side intermediate electrode 22 are made of the Cu film formed at the same time in plating described above.

The p-side intermediate electrode 21 is also formed in the inside of the contact hole 18a, and electrically connected to the p-side electrode 16 through the seed metal 19. The n-side intermediate electrode 22 is also formed in the inside of the contact hole 18b, and electrically connected to the n-side electrode 17 through the seed metal 19.

Here, the dicing region d2 is formed to extend in a direction along a side face 21a of the p-side intermediate electrode 21 and a side face 22a of the n-side intermediate electrode 22 (the transverse direction in FIG. 8B). The side face 21a and 22a are exposed in the side face 25b of the insulating resin layer 25 as shown in FIG. 1A and FIG. 1B, after dicing into an individual device.

Alternate long and short dash lines e1 and e2 in FIG. 8B indicate boundaries that are cut by both edges of a dicing blade. The side face 21a and the side face 22a shown in FIG. 8B are formed so that the side face 21a and the side face 22a locate in the dicing region d2 beyond the lines e1 and e2. In the following explanation, the alternate long and short dash line e1 will be given as the edge line e1 and the alternate long and short dash line e2 will be given as the edge line e2.

A notch 21b is formed at the corner of the p-side intermediate electrode 21 between the side face 21a and the side face 22a. Thus, it is possible to increase the distance between the side face 21a and the side face 22a exposed from the insulating resin layer 25 after dicing, and it is possible to avoid an electrical short-circuit caused by solder in mounting.

On the other hand, the distance between the p-side intermediate electrode 21 and the n-side intermediate electrode 22 except the notch 21b can be made close to the limit in processing. Namely, it is possible to increase the area of the p-side intermediate electrode 21 with no restrictions on the distance between the bonding pads 23a and 24a exposed in the side face 25b of the insulating resin layer 25. Consequently, it is possible to reduce current density by increasing the contact area between the p-side intermediate electrode 21 and the p-side electrode 16, and it is also possible to improve heat dissipation. For example, it may be possible to connect the p-side intermediate electrode 21 to the p-side electrode 16 through a plurality of contact holes 18a.

According to the embodiment, as shown in FIG. 8B, the side faces 21a and the side faces 22a are disposed not to go too far on one side of the dicing region d2 along the extended direction, and evenly provided on both sides of the dicing region d2. Thus, it is possible to equally cut the side faces 21a and the side faces 22a with both sides of the dicing blade while cutting the dicing region d2. Consequently, it is possible to make a load of cutting metal even in both edges of the dicing blade. Namely, it is possible to suppress clogging or damage of the dicing blade for prolonging the lifetime of the dicing blade.

In the example shown in FIG. 8B, the side face 21a and 22a on the edge line e1 side and the side face 21a and 22a on the edge line e2 side are alternately disposed in the direction in which the dicing region d2 extends. However, the embodiment is not limited to this layout. Preferably, the side face 21a and the side face 22a are disposed not to go too far on one side of the edge line e1 and the edge line e2.

FIG. 9A is a cross-sectional view illustrating a state in which the resist mask 41 used for plating the p-side intermediate electrode 21 and the n-side intermediate electrode 2 is removed. The resist mask 41 can be removed using an organic solvent or oxygen plasma, for example.

Subsequently, a resist mask 42 for plating interconnections is formed on the intermediate electrodes as shown in FIG. 9B. The resist mask 42 is formed thicker than the resist mask 41 described above. It is also possible that the resist mask 42 is formed as lay on the resist mask 41.

Figures 10A, 10B:
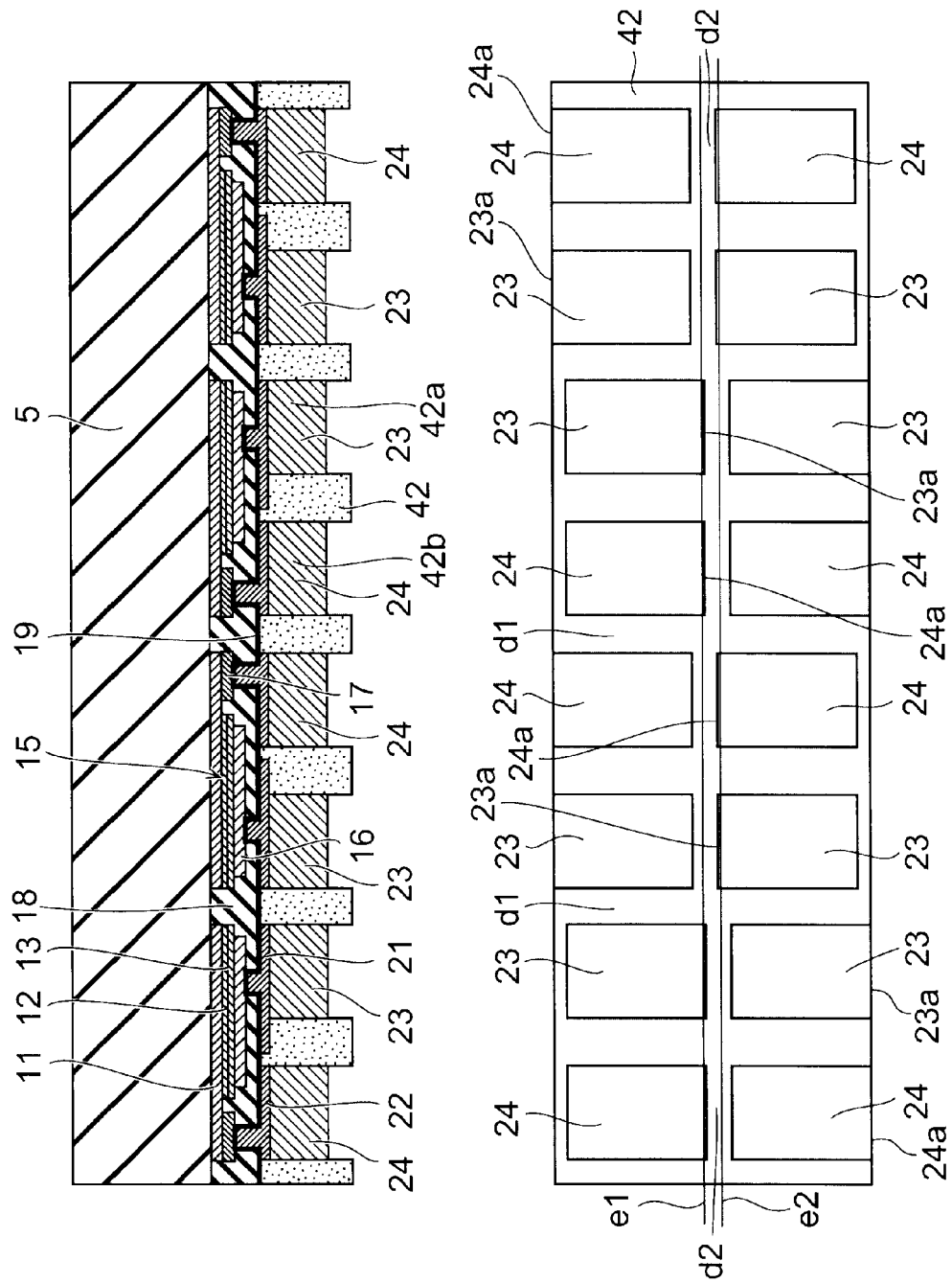

As shown in FIG. 10A and in FIG. 10B that is a bottom view of FIG. 10A, the p-side interconnection 23 and the n-side interconnection 24 are formed using electrolytic copper plating. For example, Cu films are selectively plated using the resist mask 42. Also in this case, a plating current flows via the seed metal 19, and the Cu films are formed on the p-side intermediate electrode 21 and the n-side intermediate electrode 22.

Namely, the p-side interconnection 23 is formed in the inside of an opening 42a in the resist mask 42 and on the p-side intermediate electrode 21. The n-side interconnection 24 is formed in the inside of an opening 42b in the resist mask 42 and on the n-side intermediate electrode 22. The p-side interconnection 23 and the n-side interconnection 24 are formed at the same time using the electrolytic copper plating, for example.

The p-side interconnections 23 and the n-side interconnections 24 are extended into the dicing region d2 beyond both of the edge line e1 and the edge line e2, in order to form the bonding pad 23a and the bonding pad 24a, which is the end faces of the p-side interconnection 23 and the n-side interconnection 24 exposed after dicing in the side face 25b of the insulating resin layer 25.

As shown in FIG. 10B, the projecting portions of the p-side interconnection 23 and the n-side interconnection 24 are evenly provided on both sides along the direction in which the dicing region d2 extends, not going too far on one side of the dicing region d2. The p-side interconnection 23 and the n-side interconnection 24 are evenly cut with both edges of the dicing blade while cutting the dicing region d2. Thus, it is possible to make a load of cutting metal even in both edges of the dicing blade, suppressing the clogging or damage of the dicing blade for prolonging the lifetime of the dicing blade.

It is noted that in the example shown in FIG. 10B, the p-side interconnection 23 and the n-side interconnection 24 projecting on the edge line e1 side and the p-side interconnection 23 and the n-side interconnection 24 projecting on the edge line e2 side are alternately disposed along the direction in which the dicing region d2 extends. However, the embodiment is not limited to this layout. Namely, it is sufficient that the projecting portions of the p-side interconnection 23 and the n-side interconnection 24 are disposed not to go too far on one side of the edge line e1 and the edge line e2.

The distance between the p-side interconnection 23 and the n-side interconnection 24 is formed at the width so that the bonding pads 23a and 24a exposed in the side face 25b of the insulating resin layer 25 are not short-circuited by the solder 102 in mounting.

Subsequently, as shown in FIG. 11A, the resist mask 42 is removed using a solvent or oxygen plasma, for example. Then, a resist mask 45 is formed on the interconnections for plating the p-side pillar 33 and the n-side pillar 34 as shown in FIG. 11B. The resist mask 45 may be formed as laid on the resist mask 42.

Figures 12A, 12B:
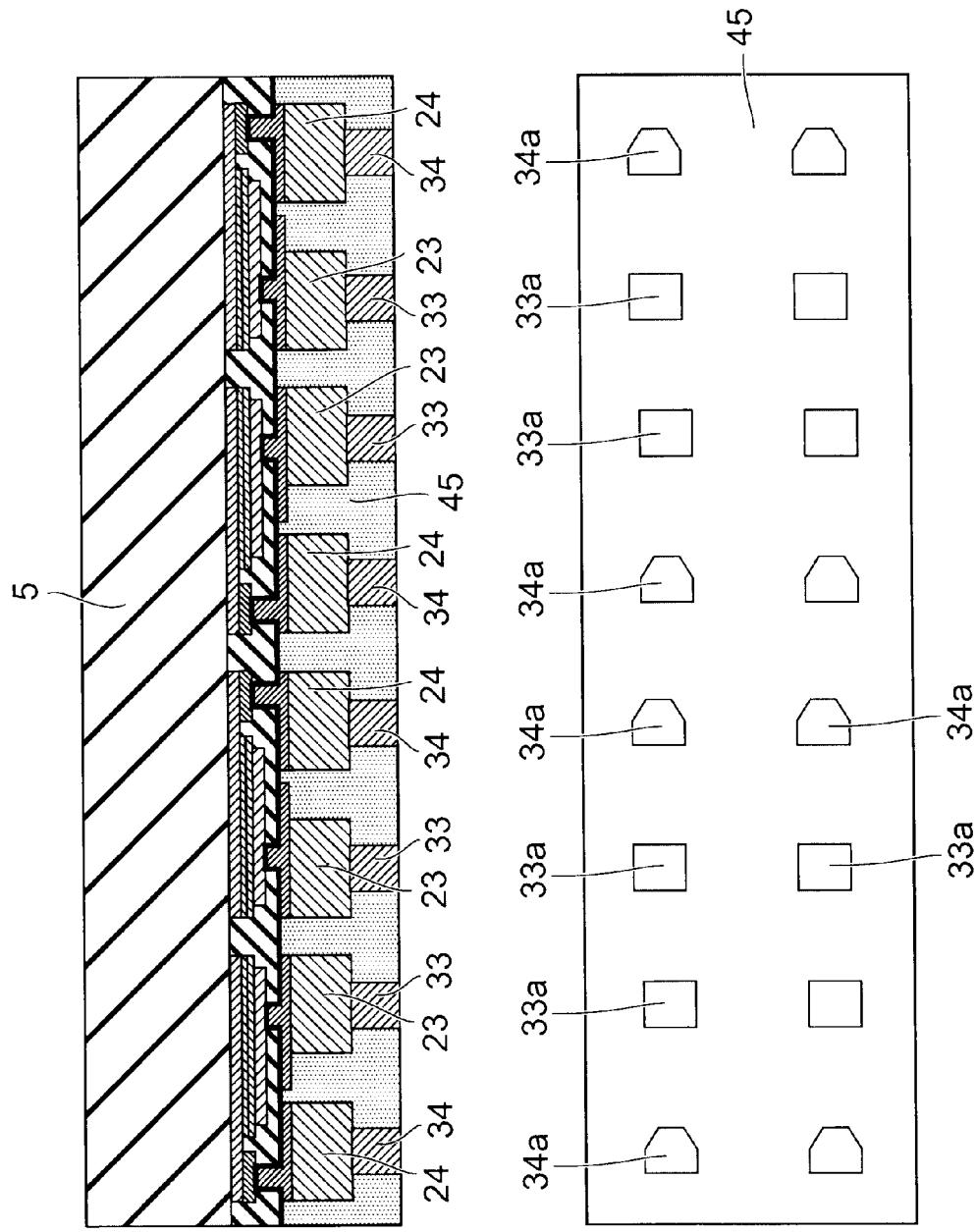

Subsequently, as shown in FIG. 12A and in FIG. 12B that is a bottom view of FIG. 12A, the p-side pillar 33 and the n-side pillar 34 are formed using electrolytic copper plating.

Namely, a Cu film is formed in openings 45a and 45b on the p-side interconnection 23 and the n-side interconnection 24 by selective plating using the resist mask 45.

As shown in FIG. 12B, the monitor pads 33a and 34b, which are the end faces of the p-side pillar 33 and the n-side pillar 34, are formed in different shapes. Thus, it is possible to distinguish between the end faces of the p-side interconnection 23 and the n-side interconnection 24 exposed in the surface 25a of the insulating resin layer 25. In other words, it is possible to distinguish between the anode and cathode of the semiconductor light emitting device. Here, the anode and cathode of the semiconductor light emitting device can be also distinguished from each other in the case where the size of the monitor pad 33a and the size of the monitor pad 34a are made different from each other, instead of different shapes.

Figures 13A, 13B:
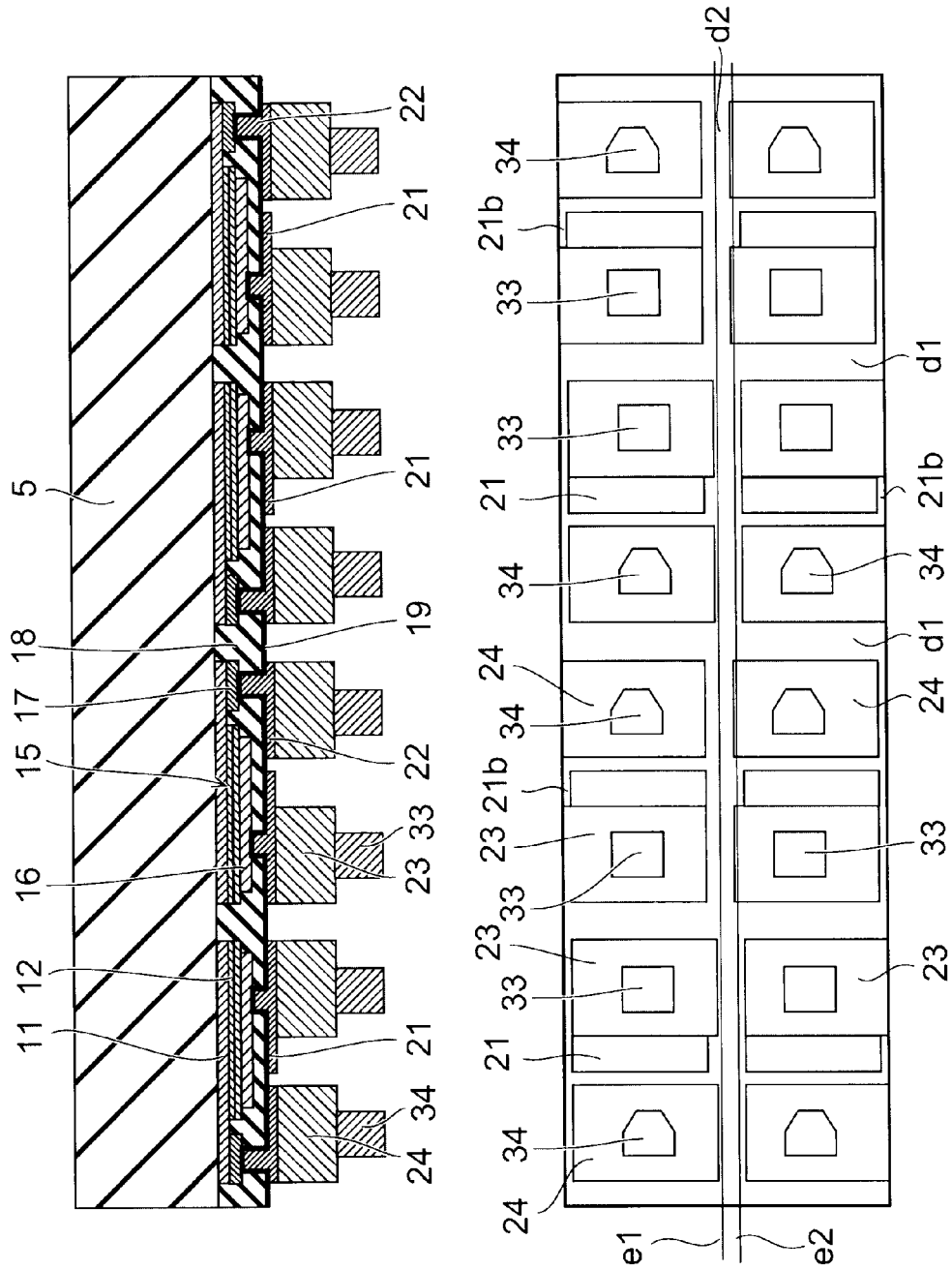

Subsequently, the resist mask 45 is removed using solvent or oxygen plasma, for example. FIG. 13A and FIG. 13B that is a bottom view of FIG. 13A illustrate a state in which the resist mask 45 is removed.

As shown in FIG. 13A, the p-side pillar 33 and the n-side pillar 34 are formed on the surfaces of the p-side interconnection 23 and the n-side interconnection 24 and positioned on the opposite side of the p-side intermediate electrode 21 and the n-side intermediate electrode 22. As shown in FIG. 13B, the p-side pillar 33 is formed in the inside of the p-side interconnection 23, and the n-side pillar 34 is formed in the inside of the n-side interconnection 24, when seeing the plane of the second major surface 15b of the stacked body 15.

As described above, the p-side interconnection 23 is formed smaller than the p-side intermediate electrode 21. Thus, as shown in FIG. 13B, the p-side intermediate electrode 21 is formed so as to extend from the p-side interconnection 23 side to the n-side interconnection 24 side, except the notch 21b.

Subsequently, as shown in FIG. 14A, the exposed portion of the seed metal 19 is removed by wet etching between the p-side interconnection 23, the n-side interconnection 24, and a part of the p-side intermediate electrode 21 extending from the p-side interconnection 23 side. Thus, the p-side intermediate electrode 21 and the n-side intermediate electrode 22 are electrically isolated from each other.

Subsequently, as shown in FIG. 14B, the insulating resin layer 25 is formed to cover the p-side interconnection 23, the n-side interconnection 24, and the surface of the insulating layer 18 exposed therebetween. The insulating resin layer 25 contains carbon black, for example, to provide a light shielding property against the light emitted from the light emitting layer 13. The insulating resin layer 25 may contain titanium oxide powder or the like to reflect the light emitted from the light emitting layer 13.

Subsequently, the substrate 5 is removed as shown in FIG. 15A. The substrate 5 may be removed by using laser lift-off method, for example. For example, a laser beam is applied toward the n-type GaN layer 11 from the back surface of the substrate 5 opposite to the stacked body 15. The laser beam has transparency to the substrate 5, and absorbed in the n-type GaN layer 11. In an interface between the substrate 5 and the n-type GaN layer 11, the n-type GaN layer 11 near the interface absorbs the energy of the laser beam and decomposed into Ga and N. This decomposition reaction separates the substrate 5 from the n-type GaN layer 11.

The laser beam is applied at a plurality of times and each of predetermined regions over the entire wafer is illuminated in a predetermined order. Thus, the substrate 5 is removed from the first major surface 15a of the stacked body 15, improving light extraction efficiency.

Alternately, when the silicon substrate is used for the substrate 5, it may be possible to remove the substrate 5 using wet etching.

The stacked body 15 separated from the substrate 5 is supported by the insulating resin layer 25 provided on the second major surface 15b side. The p-side interconnection 23 and the n-side interconnection 24 is formed sufficiently thick by the copper plating, and the gap between the p-side interconnection 23 and the n-side interconnection 24 is filled with the insulating resin layer 25. Thus, it is possible to secure the mechanical strength of the wafer after removing the substrate 5.

The insulating resin layer 25 and the metals of the intermediate electrodes and the interconnection are softer than the substrate 5. Thus, the insulating resin layer 25 may absorb the internal stress stored in the stacked body 15 in the process of crystal growth, when removing the substrate 5. Therefore, it is possible to avoid crystal destruction such as cracks generated in the stacked body 15.

Subsequently, the first major surface 15a of the stacked body 15 is cleaned after removing the substrate therefrom. For example, gallium (Ga) remaining on the first major surface 15a is removed with hydrochloric acid or the like.

The first major surface 15a is further etched with KOH (potassium hydroxide) aqueous solution, TMAH (tetramethyl ammonium hydroxide), or the like, for example. Thus, as shown in FIG. 15B, projections and depressions are formed on the first major surface 15a due to differences in the etching rate depending on crystal plane orientations. Alternatively, projections and depressions may be formed on the first major surface 15a by patterning using a resist mask, for example. The projections and depressions formed on the first major surface 15a improve light extraction efficiency from the stacked body 15.

Figure 16A:
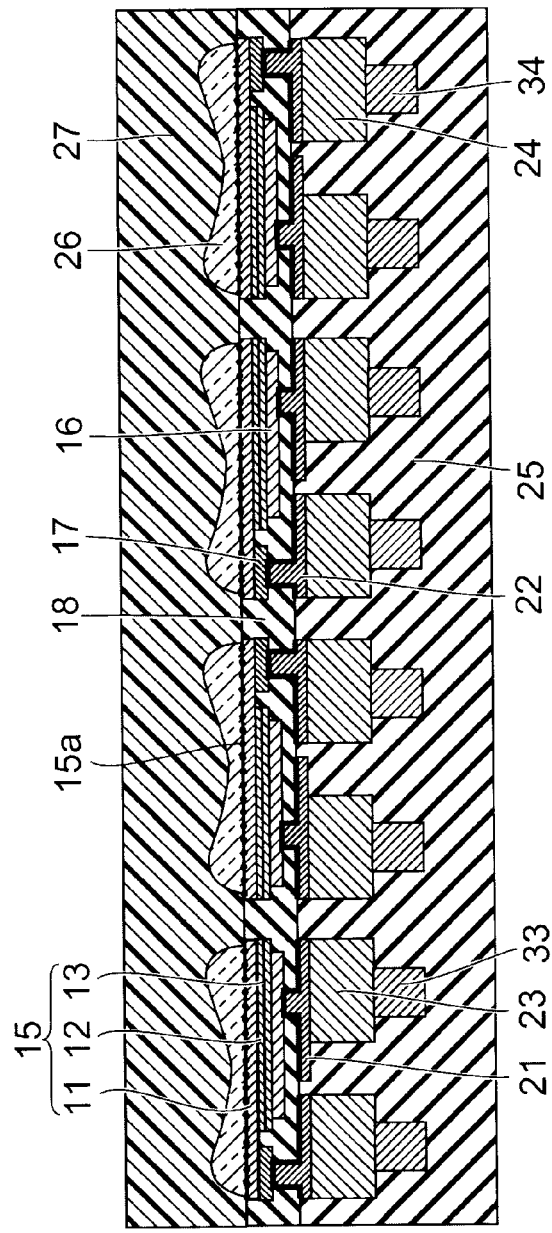

Subsequently, as shown in FIG. 16A, the transparent resin layer 27 is formed on the first major surface 15a and on the insulating layer 18 exposed between the adjacent stacked bodies 15. The transparent resin layer 27 is formed using a method such as printing, potting, molding, or compression molding by supplying a liquid transparent resin, for example, having fluorescent particles dispersed therein and thermosetting it on the first major surface 15a. A material transparent to the light emitted from the light emitting layer 13 and the light emitted from the fluorescent particles, such as silicone resin, acrylic resin, liquid glass, for example, is used for the transparent resin.

The lens 26 may be formed between the first major surface 15a and the transparent resin layer 27. A material transparent to the light emitted from the light emitting layer 13, such as silicone resin, acrylic resin, or glass, for example, can be used for the lens 26. Alternatively, the lens 26 may be formed by etching using a grayscale mask, or by imprinting, for example.

It is noted that such a structure may be possible in which the lens 26 is not provided between the first major surface 15a and the transparent resin layer 27.

Figure 16B:
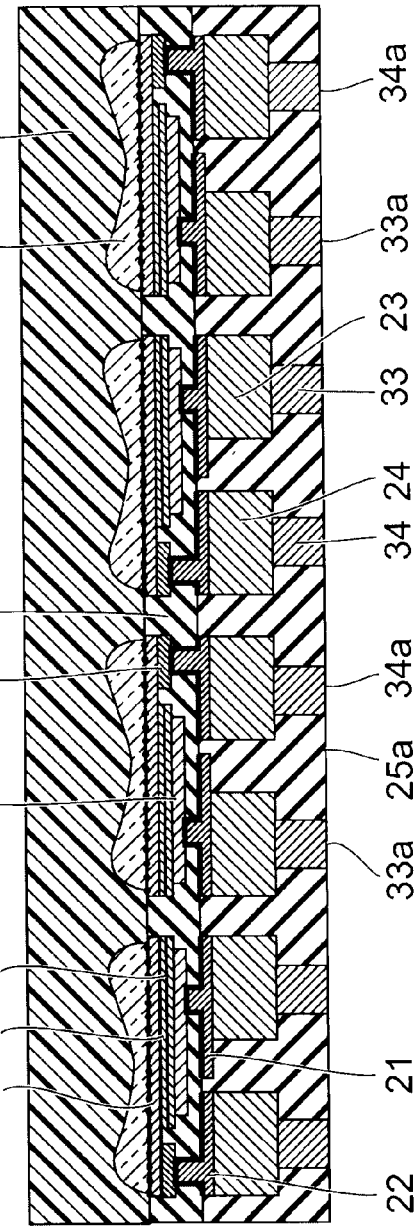

Subsequently, the major surface of the insulating resin layer 25 opposite to the transparent resin layer 27 is ground to be thinner as shown in FIG. 16B. The monitor pads 33a and 34a, which are the end faces of the p-side pillar 33 and the n-side pillar 34, are exposed in the surface 25a of the insulating resin layer 25 after the grinding.

Figures 17A, 17B:
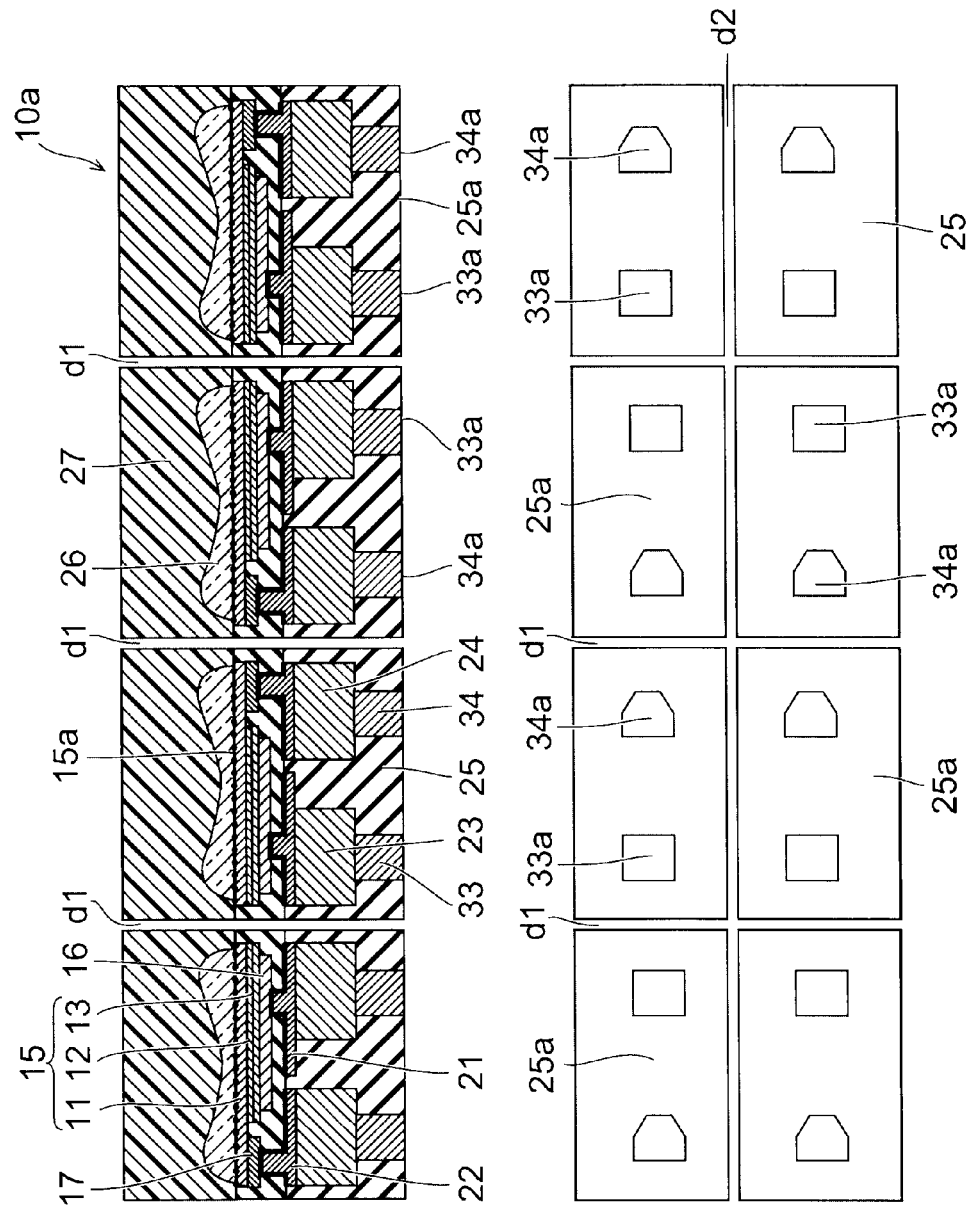

Subsequently, as shown in FIG. 17A and FIG. 17B, the wafer is diced into individual semiconductor light emitting devices 10a by cutting the transparent resin layer 27, the insulating layer 18, and the insulating resin layer 25 along the dicing regions d1 and d2 formed in a grid. The transparent resin layer 27, the insulating layer 18, and the insulating resin layer 25 can be cut using the dicing blade or laser beam, for example.

The projecting portions of the p-side interconnection 23 and the n-side interconnection 24 beyond the edge lines e1 and e2 are cut in the dicing process. Thus, the bonding pads 23a and 24a are exposed in the side face of the insulating resin layer 25.

Similarly, the projecting portions of the p-side intermediate electrode 21 and the n-side intermediate electrode 22 into the dicing region d2 are also cut in the dicing process. Therefore, the side face 21a of the p-side intermediate electrode 21 and the side face 22a of the n-side intermediate electrode 22 are also exposed in the side face 25b of the insulating resin layer 25 (see FIG. 1A).

The substrate 5 is already removed before dicing, and the stacked body 15 does not exist in the dicing regions d1 and d2. Thereby, it is possible to avoid damaging the stacked body 15 in the dicing process. After the die separation, such a structure is obtained in the semiconductor light emitting device 10a, in which the end parts (the side faces) of the stacked body 15 are covered and protected with the insulating layer 18.

It is noted that the semiconductor light emitting device 10a separated into dies may be a single chip structure including a single stacked body 15, or may be a multi-chip structure including a plurality of stacked bodies 15.

The semiconductor light emitting device 10a is completed in a form covered with a resin and exposing the bonding pads in the resin, when finishing the wafer processing and separating into dies. Thus, it is unnecessary to carry out a process for interconnecting and packaging an individual chip, thereby the production costs is significantly reduced. That is, interconnecting and packaging chips are already finished in the separated dies. Therefore, it is possible to improve productivity, and ultimately to facilitate price reduction.

In the semiconductor light emitting device 10a according to this embodiment, the monitor pads 33a and 34a are exposed in the surface 25a of the insulating resin layer 25. Consequently, it is possible to measure characteristics by contacting probe terminals with the monitor pads 33a and 34a of the individual semiconductor light emitting devices 10a after dicing, for example. Thus, it is possible to pick up only the chips conforming to the specification among a plurality of semiconductor light emitting devices 10a, and it is possible to improve yields in the subsequent processes.

Since the shapes of the monitor pads 33a and 34a, which are the end faces of the p-side pillar 33 and the n-side pillar 34, respectively, are different from each other, it is possible to automatically recognize a monitor pad to be contacted with a positive probe and a monitor pad to be contacted with a negative probe, for example, from the monitor pads 33a and 34a. It is also possible to distinguish the orientation of the side face by automatically recognizing the shapes of the monitor pads 33a and 34a and to place the side face 25b, in which the bonding pads 23a and 24a are exposed, toward the mounting substrate 100 in the mounting process of the semiconductor light emitting device 10a.

For example, as shown in FIG. 17B, the disposition of the monitor pads 33a and 34a is inverted at every semiconductor light emitting device 10a in the direction in which the dicing region d2 extends. In this case, the different shapes of the monitor pads 33a and 34a are effective to distinguish the side face 25b from the other faces.

When seeing the second major surface 15b side of the stacked body 15, the areas of the monitor pads 33a and 34a are narrower than the areas of the p-side interconnection 23 and the n-side interconnection 24, respectively. The monitor pads 33a and 34a are provided in the inside of each interconnection. Thus, the bonding pads 23a and 24a are separated from the monitor pads 33a and 34a via the insulating resin layer 25 at the corner between the surface 25a and 25b.

Figure 26A:
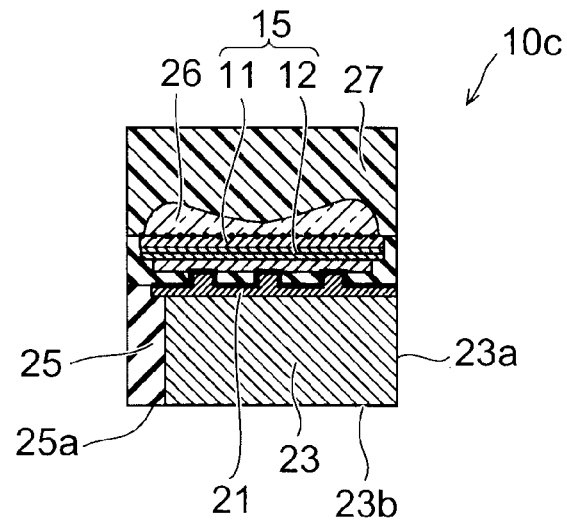
FIGS. 26A to 26C are schematic views illustrating a semiconductor light emitting device according to a comparative example.
Figure 26B:
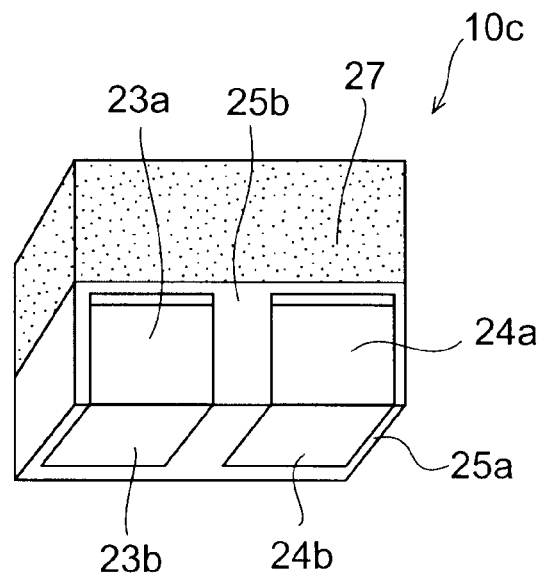

For example, in a semiconductor light emitting device 10c according to a comparative example shown in FIG. 26A and FIG. 26B, a p-side pillar 33 and an n-side pillar 34 are not provided, and the end faces of a p-side interconnection 23 and an n-side interconnection 24 are exposed in a surface 25a and a side face 25b of an insulating resin layer 25. The areas of monitor pads 23b and 24b exposed in the surface 25a of the insulating resin layer 25 are the same as the areas of the p-side interconnection 23 and the n-side interconnection 24 when seeing the second major surface 15b side. Consequently, as shown in FIG. 26B, the monitor pad 23b is connected to the bonding pad 23a and the monitor pad 24b is connected to the bonding pad 24b at the corner between the surface 25a and the side face 25b of the insulating resin layer 25.

Figure 26C:
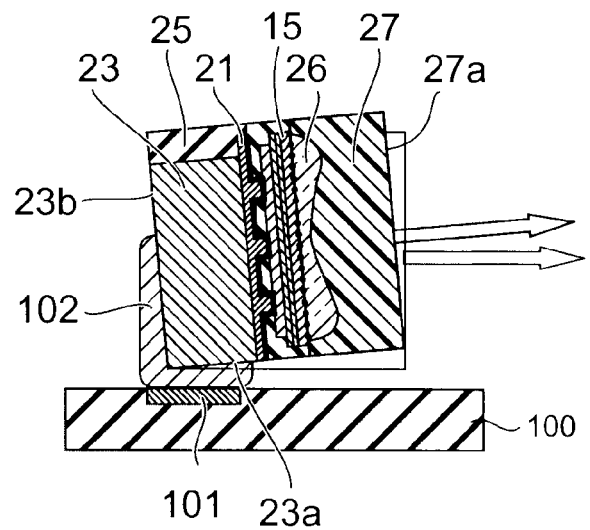

FIG. 26C is a cross-sectional view illustrating the semiconductor light emitting device 10c bonded on a mounting substrate 100. Since the bonding pad 23a is connected to the monitor pad 23b, and the bonding pad 24a is connected to the monitor pad 24b, solder 102 provided for mounting the semiconductor light emitting device 10c not only contacts with the bonding pad 23a but also crawls up on the monitor pad 23b side as shown in FIG. 26C. In such a case, the contraction of the solder 102 sometimes causes a light emitting face 27a to lean upward, resulting in a shift of the light emitting direction.

On the contrary, in the semiconductor light emitting device 10a according to the embodiment, the bonding pads 23a and 24a are separated from the monitor pads 33a and 34a via the insulating resin layer 25. Thus, it is possible to prevent the solder 102 from the crawling up, and to suppress the shifting of the light emitting direction after mounting.

Second Embodiment

Next, according to a second embodiment, a manufacturing method for a semiconductor light emitting device 10a will be described with reference to FIG. 18, FIG. 19A, and FIG. 19B.

Figure 18:
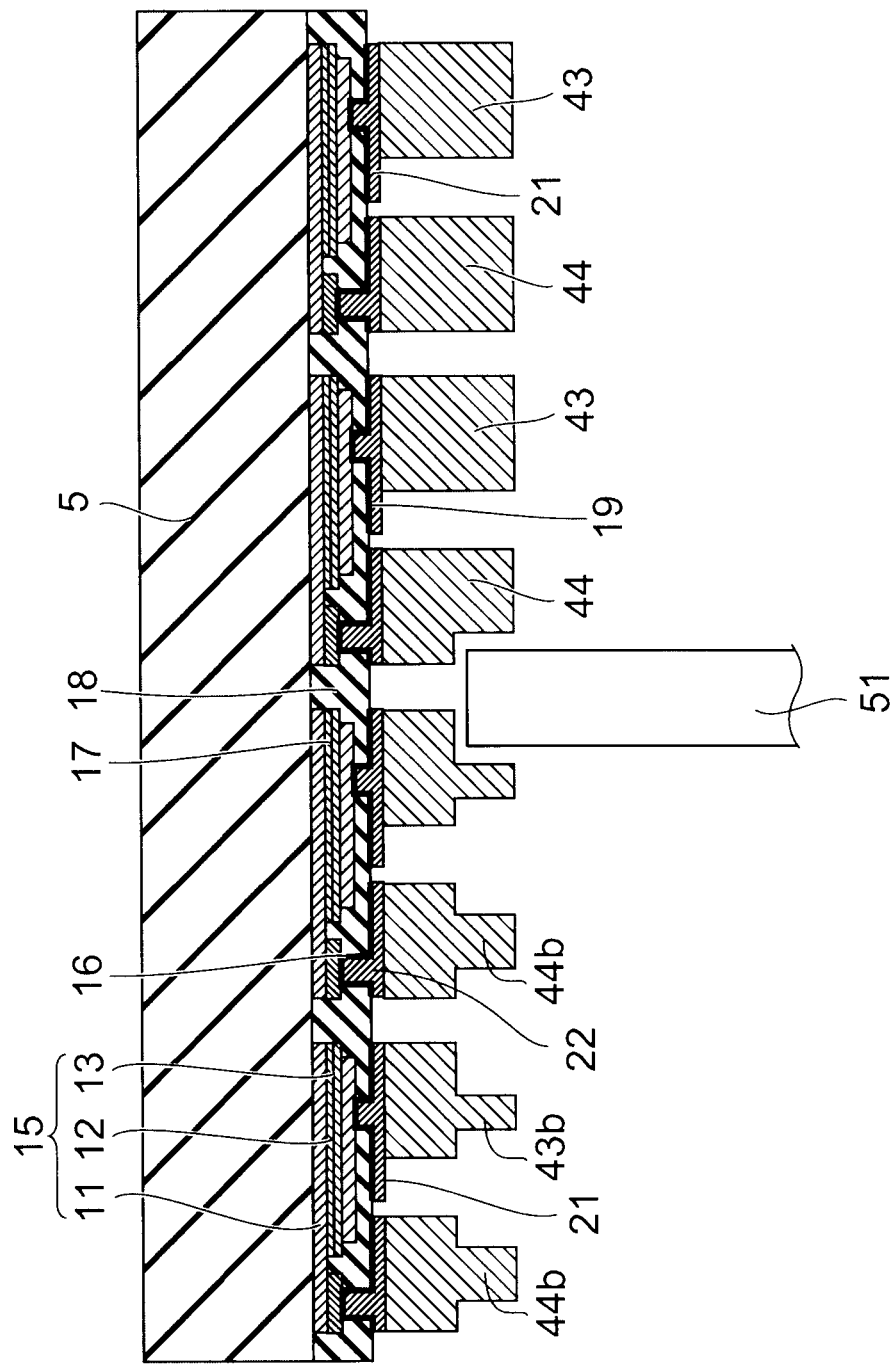

FIG. 18 is a schematic view illustrating a cross section of a wafer in the manufacturing processes of the semiconductor light emitting device 10a. After forming a p-side interconnection 43 and an n-side interconnection 44 on the surfaces of a p-side intermediate electrode 21 and an n-side intermediate electrode 22, a part of a seed metal 19 formed on the surface of an insulating layer 18 is removed to electrically isolate the p-side intermediate electrode 21 and the n-side intermediate electrode 22 from each other. As shown in FIG. 18, the surface on the opposite side of intermediate electrodes of the p-side interconnection 43 and the n-side interconnection 44 is ground with a dicing blade 51, for example, in order to form a p-side pillar 43b and an n-side pillar 44b.

Figures 19A, 19B:
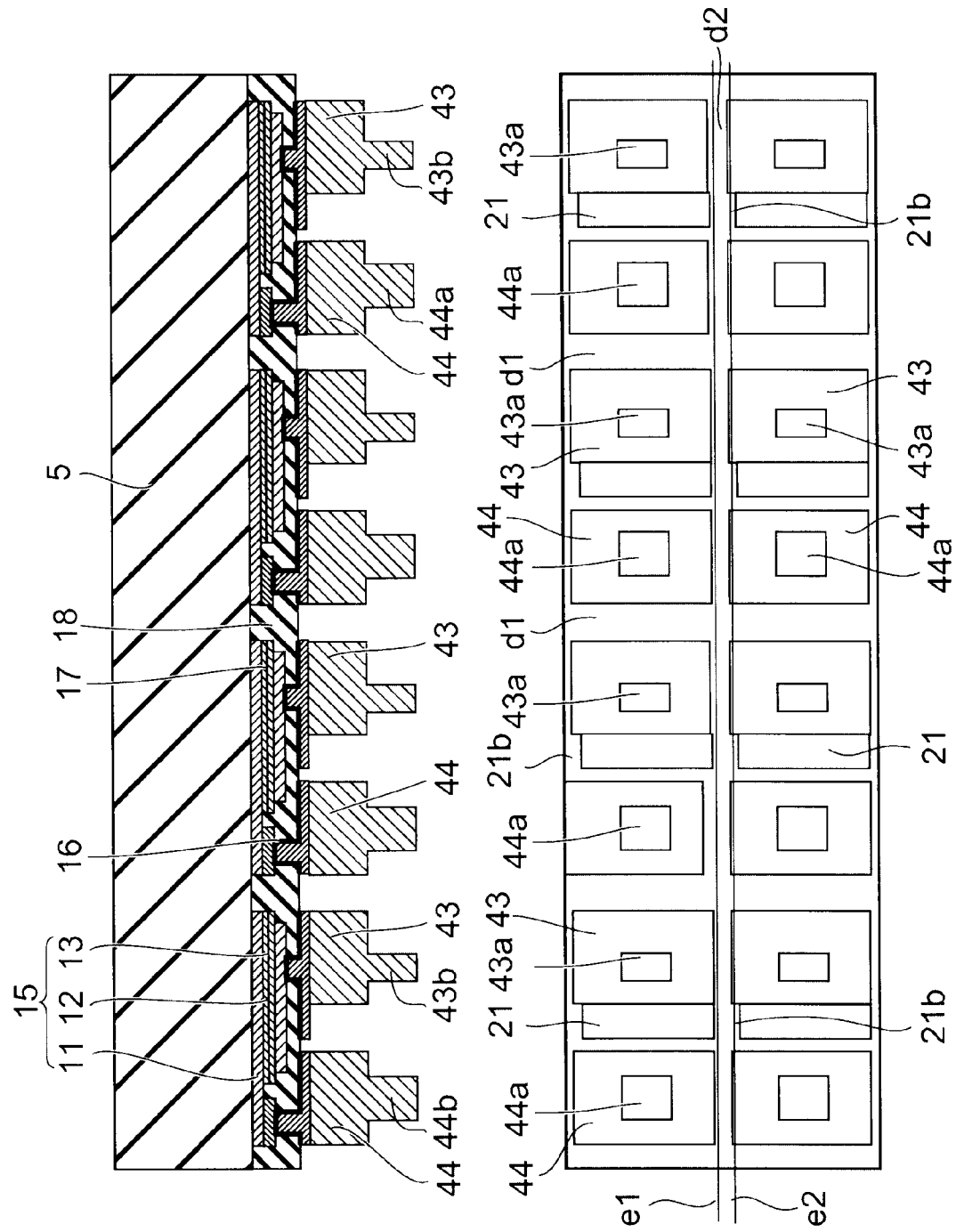

FIG. 19A is a schematic view illustrating a cross section of the wafer and FIG. 19B is a bottom view of FIG. 19A. The p-side pillar 43b and the n-side pillar 44b are formed on the surfaces of the p-side interconnection 43 and the n-side interconnection 44.

As shown in FIG. 19B, an end face 43a of the p-side pillar 43b and an end face 44a of the n-side pillar 44b are formed in different shapes. For example, the end faces 43a and 44b can be processed in quadrilaterals with different width from each other.

In the semiconductor light emitting device 10a illustrated in the embodiment, an exposed surface 11a of an n-type GaN layer 11 is formed on the same side of the stacked body 15 along a dicing region d2. The p-side interconnection 43 and the n-side interconnection 44 are alternately formed along the dicing region d2. Thus, as shown in FIG. 19B, a part of the p-side intermediate electrode 21 exposed between the p-side interconnection 43 and the n-side interconnection 44 also extends along the same direction from the p-side interconnection 43 side to the dicing region d2.

A notch 21b of the p-side intermediate electrode 21 is formed at the end portion on the same side in the direction in which a dicing region d1 extends. The p-side interconnection 43 and the n-side interconnection 44 are formed so as to extend in the dicing region d2 beyond the edge line e2.

Subsequently, as similar to FIG. 14B, an insulating resin layer 25 is provided to cover the p-side interconnection 43, the n-side interconnection 44, and the surface of the insulating layer 18. The semiconductor light emitting device 10a is formed through the same manufacturing processes as the above-mentioned first embodiment.

In the manufacturing method according to the embodiment, the p-side pillar 43b and the n-side pillar 44b are formed by grinding using the dicing blade, so that it is possible to simplify the manufacturing processes and to reduce costs.

Third Embodiment

FIG. 20A and FIG. 20B are cross-sectional views illustrating manufacturing processes of a semiconductor light emitting device 10b according to a third embodiment.

In the manufacturing processes of the semiconductor light emitting device 10b shown in FIG. 20A, a substrate 5 reduced in the thickness is left on the first major surface 15a side. For example, the major surface of the substrate 5 on the opposite side of a stacked body 15 is ground using a grinder to reduce the thickness of the substrate 5.

Subsequently, as shown in FIG. 20B, a dicing region d1 and a dicing region d2, not shown, are cut using a dicing blade, so that the semiconductor light emitting device 10b is separated into dies. The substrate 5 may be split in which the dicing regions d1 and d2 are half cut from the insulating resin layer 25 side using the dicing blade and then a laser beam is applied to completely cut into the dies. Alternatively, all of the portions of the substrate 5 may be cut by applying a laser beam.

The substrate 5 is a sapphire substrate, for example, and transparent to the light emitted from a nitride semiconductor light emitting layer 13. In this case, there is no layer containing a fluorescent body on the first major surface 15a side, and only the light emitted from the light emitting layer 13 is emitted to outwards. A transparent resin layer containing fluorescent particles may also be formed on the major surface of the substrate 5 on the opposite side of the stacked body 15.

In the semiconductor light emitting device 10b according to the embodiment, the substrate 5 remains, so that it is possible to provide a highly reliable structure with improved mechanical strength.

Fourth Embodiment

FIG. 21A and FIG. 21B are cross-sectional views illustrating manufacturing processes of a semiconductor light emitting device according to a fourth embodiment. FIG. 21A is a schematic view illustrating a cross section of a wafer which is in the same process shown in FIG. 7A. FIG. 21B is a schematic view illustrating a cross section of the wafer, which is in the same process shown in FIG. 16B.

In the manufacturing processes of the semiconductor light emitting device according to the embodiment, an opening 53 is formed in dicing regions d1 and d2, while forming contact holes 18a and 18b on an insulating layer 18 as shown in FIG. 21A. The subsequent processes are carried out as similar to the processes of the first embodiment.

FIG. 21B illustrates a state in which an insulating resin layer 25 is formed on the second major surface 15b side of a stacked body 15 and then monitor pads 33a and 34a are exposed in the insulating resin layer 25. The insulating resin layer 25 is also filled in the inside of the opening 53 provided in the dicing region d1.

For example, the insulating layer 18 may be formed with polyimide or the inorganic material, which is transparent to the light emitted from a light emitting layer 13. Due to this transparency, light sometimes leaks from the end face of the insulating layer 18 exposed in the side face of the semiconductor light emitting device 10a (see FIG. 1B and FIG. 1C).

On the contrary, in the semiconductor light emitting device according to the embodiment, the insulating resin layer 25 covers the end face of the insulating layer 18. The insulating resin layer 25 having the light shielding property fills with the opening 53, thereby it becomes possible to suppress the light leakage from the side face. Alternatively, a resin reflecting light emission may fills with the opening 53, or a reflecting film may be formed on the inner surface of the opening 53.

Covering the insulating layer 18 with the insulating resin layer 25 suppresses moisture absorption at the side face, thereby improving the device reliability. Furthermore, the simplified layer structure in the dicing regions d1 and d2 makes cutting easier and suppresses damages at the cutting face in the dicing process using a dicing blade.

Fifth Embodiment

Figures 22A, 22B:
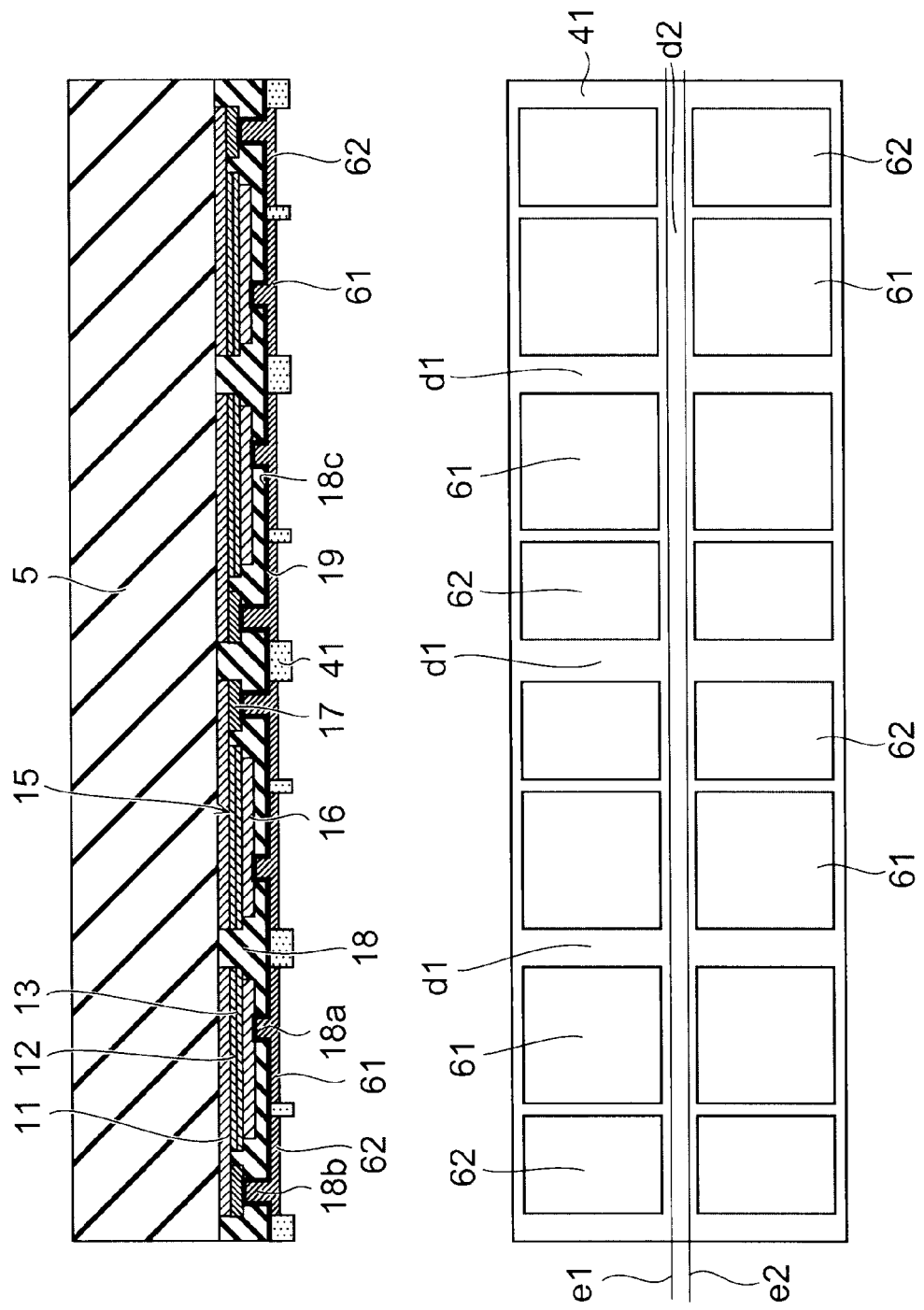

FIG. 22A, FIG. 22B, FIG. 23A, and FIG. 23B are cross-sectional views illustrating manufacturing processes of a semiconductor light emitting device according to a fifth embodiment. FIG. 22A and FIG. 22B are schematic views partially illustrating the cross section and bottom face of a wafer which is in the same processes shown in FIG. 8A and FIG. 8B. FIG. 23A and FIG. 23B are schematic views partially illustrating the cross section and bottom face of the wafer which is in the processes shown in FIG. 10A and FIG. 10B.

As shown in FIG. 22A, a p-side intermediate electrode 61 and an n-side intermediate electrode 62 are selectively formed on a surface 18c of an insulating layer 18. The p-side intermediate electrode 61 and the n-side intermediate electrode 62 are formed at the same time by electrolytic copper plating, for example, using the seed metal 19 as a conductive layer as similar to the p-side intermediate electrode 21 and the n-side intermediate electrode 22.

As shown in FIG. 22B, the side faces of the p-side intermediate electrode 61 and the n-side intermediate electrode 62 do not project into a dicing region d2 beyond edge lines e1 and e2 according to the embodiment. This point is different from the manufacturing processes shown in FIG. 8A and FIG. 8B. Consequently, the ends of the p-side intermediate electrode 61 and the n-side intermediate electrode 62 are not cut by a dicing blade, and the end faces thereof are not exposed in a side face 25b of an insulating resin layer 25.

As shown in FIG. 23A, a p-side interconnection 63 and an n-side interconnection 64 are formed on the p-side intermediate electrode 61 and the n-side intermediate electrode 62. For example, a resist mask 42 is used to selectively form a Cu film. Also in this case, a plating current flows via the seed metal 19 to form the Cu film. It is noted that a second seed metal may be formed after forming the p-side intermediate electrode 61 and the n-side intermediate electrode 62, and the plating current may flow via the second seed metal.

In the embodiment, a side face 63a of the p-side interconnection 63 and a side face 64a of the n-side intermediate electrode 64 are formed so as to project into the dicing region d2 beyond the edge lines e1 and e2. Thus, the ends of the p-side intermediate electrode 61 and the n-side intermediate electrode 62 are cut with the dicing blade, and each of the end faces thereof is exposed in the side face 25b of the insulating resin layer 25 as a part of bonding pad.

FIG. 24A and FIG. 24B are cross-sectional views illustrating a semiconductor light emitting device 10d according to a variation of the fifth embodiment. FIG. 24A is a schematic plan view illustrating a wafer in the manufacturing processes shown in FIG. 22A and FIG. 22B. FIG. 24B is a perspective view schematically illustrating the semiconductor light emitting device 10d.

According to the embodiment, a side face 73a of the p-side interconnection 73 and a side face 74a of the n-side interconnection 74 project into a dicing region d2 beyond edge lines e1 and e2, respectively, as shown in FIG. 24A. A side face 73b of the p-side interconnection 73 and a side face 74b of the n-side interconnection 74 project into a dicing region d1 beyond an edge line e3 and an edge line e4.

Thus, the side faces 73b and 74b are also cut with a dicing blade, in addition to the side face 73a of the p-side interconnection 73 and the side face 74a of the n-side interconnection 74. Consequently, as shown in FIG. 24B, the bonding pads 73a and 74a are exposed in a side face 25b of an insulating resin layer 25, and the end face 73b of the p-side interconnection 73 and the end face 74b of the n-side interconnection 74 are exposed in a side face 25c on both sides connecting to the side face 25b in the semiconductor light emitting device 10d.

For example, when mounting the semiconductor light emitting device 10d on the mounting substrate, the bonding pads 73a and 74a are faced to the surface 103, as shown in FIG. 2. The solder 102 not only connects the bonding pads 73a and 74a to a pad 101 but also crawls up on the end face 73b of the p-side interconnection 73 and the end face 74b of the n-side interconnection 74 exposed in the side face 25c. Hence, by identifying whether the solder 102 crawls up on the end face 73b and the end face 74b or not, it may become possible to determine the conformity of joining between the semiconductor light emitting device 10d and the mounting substrate 100.

Furthermore, the light emitting direction is not shifted as shown in FIG. 26C in the semiconductor light emitting device 10d, since the solder 102 crawls up on both side faces 25c of the insulating resin layer 25, which are connected to the bonding surface (the side face 25b).

Sixth Embodiment

Figure 25A:
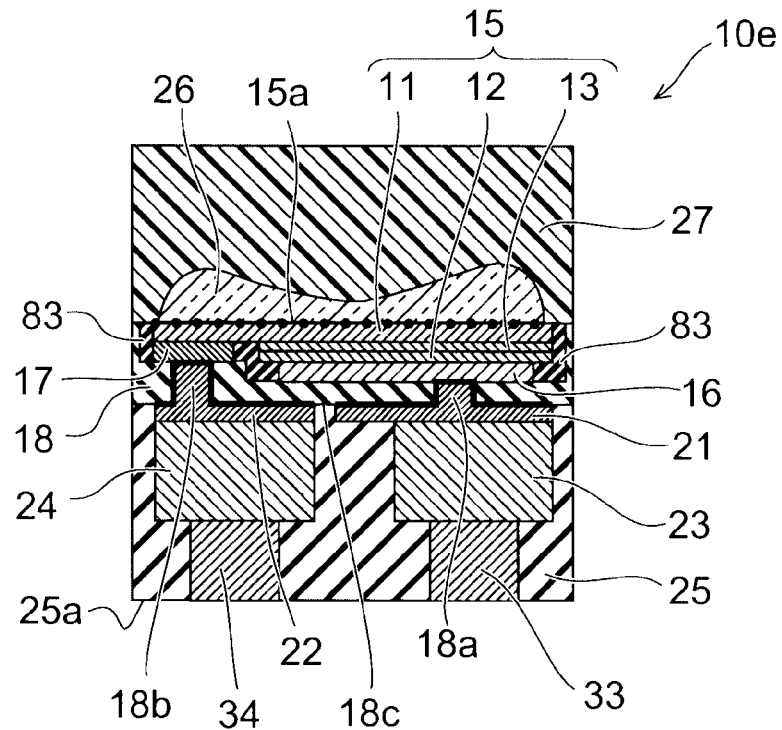
FIGS. 25A and 25B are schematic views illustrating a semiconductor light emitting device according to a sixth embodiment.
Figure 25B:
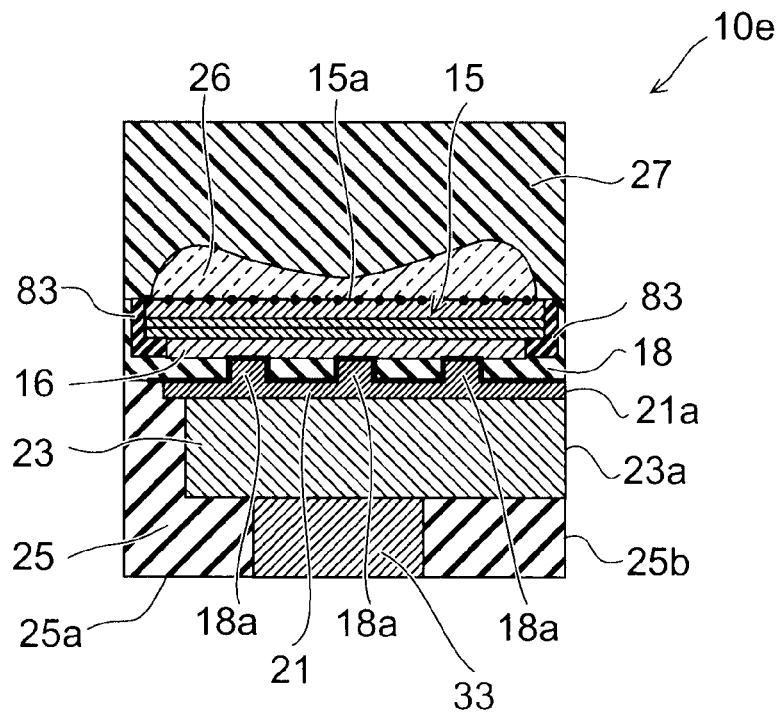

FIGS. 25A and 25B are schematic cross-sectional views illustrating a semiconductor light emitting device 10e according to a sixth embodiment. FIG. 25A is a cross-sectional view corresponding to the cross-section taken along a line A-A in FIG. 1A. FIG. 25B is a cross-sectional view corresponding to the cross-section taken along a line B-B in FIG. 1A.

The semiconductor light emitting device 10e further includes a passivation film 83 that covers the p-type GaN layer 12, the n-type GaN layer 11 and the light emitting layer 13, in addition to the structure shown in FIGS. 1B and 1C. The passivation film 83 is made of silicon oxide or silicon nitride, for example, and reduces leak current between the p-type GaN later 12 and the n-type GaN layer 11. The passivation film 83 also protects the surface of each layer, and improves the device reliability. The passivation film 83 is formed on each of the layers in the step shown in FIG. 5, after selectively removing the p-type GaN layer 12 and the light emitting layer 13 in order to expose a part of the n-type GaN layer 11 on the second major surface 15b side. Subsequently, after opening contact windows in the passivation film 83, the p-side electrode 16 and the n-side electrode 17 are formed using a lift-off method, for example. Then, the semiconductor light emitting device 10e is completed through the steps shown after FIG. 7.

Alternatively, the passivation film 83 may serve as the insulating layer 18, when the passivation film 83 is made of the same material with the insulating layer 18

In the specification, the term "nitride semiconductor" includes III-V compound semiconductors $B_x In_y Al_z Ga_{1-x-y-z} N$ ($0 \leq x \leq 1, 0 \leq y \leq 1, 0 \leq z \leq 1, 0 \leq x+y+z \leq 1$), and also includes mix crystals containing phosphorus (P), arsenic (As), or the like, in addition to N (nitrogen), for V group elements. The term "nitride semiconductor" includes those containing various elements to be added for controlling various physical properties such as conductive types, and those further containing various elements that are contained unintentionally.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
    a stacked body including a first semiconductor layer of a first conductive type, a second semiconductor layer of a second conductive type, and a light emitting layer provided between the first semiconductor layer and the second semiconductor layer, the stacked body emitting light from a first major surface on a second semiconductor layer side;
    a first electrode connected to the first semiconductor layer on a second major surface side of the stacked body opposite to the first major surface;
    a second electrode connected to the second semiconductor layer on the second major surface side;
    a first interconnection connected to the first electrode;
    a second interconnection connected to the second electrode;
    a first pillar connected to the first interconnection;
    a second pillar connected to the second interconnection; and
    a first insulating layer provided on the first interconnection, the second interconnection, the first pillar, and the second pillar on the second major surface side,
    the first pillar having a first monitor pad exposed in a surface of the first insulating layer parallel to the first major surface,
    the first interconnection having a first bonding pad exposed in a side face connected with the surface of the first insulating layer,
    the second pillar having a second monitor pad exposed in the surface of the first insulating layer,
    the second interconnection having a second bonding pad exposed in the side face of the first insulating layer.

2. The device according to claim 1, wherein the first monitor pad and the second monitor pad are different from each other in at least one of a shape and size.

3. The device according to claim 2, wherein the first monitor pad is provided within a periphery of the first interconnection, and the second monitor pad is provided within a periphery of the second interconnection.

4. The device according to claim 1, wherein the first monitor pad and the first bonding pad are separated from each other via the first insulating layer; and the second monitor pad and the second bonding pad are separated from each other via the first insulating layer.

5. The device according to claim 1, further comprising a transparent resin layer provided on the first major surface.

6. The device according to claim 5, further comprising a lens provided between the stacked body and the transparent resin.

7. The device according to claim 1, wherein the first insulating layer includes at least one of epoxy resin, silicone resin, and fluorine resin.

8. The device according to claim 7, wherein the first insulating layer has a light shielding property against light emitted from the light emitting layer.

9. The device according to claim 7, wherein the first insulating layer includes a member reflecting light emitted from the light emitting layer.

10. The device according to claim 1, further comprising a second insulating film provided between the stacked body and the first insulating film and covering the stacked body, the first electrode, and the second electrode.

11. The device according to claim 10,
wherein the first interconnection is electrically connected to the first electrode through a contact hole provided on the second insulating film; and
the second interconnection is electrically connected to the second electrode through a contact hole provided on the second insulating film.

12. The device according to claim 10, wherein the second insulating film is made of polyimide or inorganic material.

13. The device according to claim 1, further comprising a sapphire substrate provided on the first major surface.

14. The device according to claim 13, wherein the insulating layer, the first interconnection, and the second interconnection are softer than the sapphire substrate.

* * * * *